United States Patent [19]
Rice et al.

[11] Patent Number: 5,925,212
[45] Date of Patent: Jul. 20, 1999

[54] APPARATUS AND METHOD FOR ATTAINING REPEATABLE TEMPERATURE VERSUS TIME PROFILES FOR PLASMA HEATED INTERACTIVE PARTS USED IN MASS PRODUCTION PLASMA PROCESSING

[75] Inventors: Michael Rice, Pleasanton; David W. Groechel, Los Altos Hills; James Cruse, Santa Cruz; Kenneth S. Collins, San Jose, all of Calif.

[73] Assignee: Applied Materials, Inc., Santa Clara, Calif.

[21] Appl. No.: 08/524,135

[22] Filed: Sep. 5, 1995

[51] Int. Cl.$^6$ .............................. C23F 1/02; C23C 14/00; B44C 1/22; C03C 15/00

[52] U.S. Cl. ................. 156/345; 204/192.1; 204/298.01; 204/298.31; 216/58; 216/63; 216/67; 438/689; 438/715

[58] Field of Search ......................... 156/345; 204/192.1, 204/298.01, 298.31; 216/58, 63, 67; 438/689, 715

[56] References Cited

FOREIGN PATENT DOCUMENTS 552 491  7/1993  European Pat. Off. .
0 650 182 A1  4/1995  European Pat. Off. .

*Primary Examiner*—James C. Housel
*Assistant Examiner*—V. Ryan
*Attorney, Agent, or Firm*—Fliesler, Dubb, Meyer & Lovejoy

[57] ABSTRACT

The temperatures of scavenger-emitting kit parts in a high-density plasma (HDP) etching system are elevated to or close to respective steady state equilibrium temperatures so that scavenger chemistry and rates remain substantially the same on a wafer-to-wafer basis. A relatively inert warm-up plasma is turned on within the HDP chamber during idle time periods that precede or occur between executions of a predefined plasma-processing recipe so as to raise the temperatures of chamber-internal kit parts.

31 Claims, 9 Drawing Sheets

APPARATUS AND METHOD FOR ATTAINING REPEATABLE TEMPERATURE VERSUS TIME PROFILES FOR PLASMA HEATED INTERACTIVE PARTS USED IN MASS PRODUCTION PLASMA PROCESSING

INVENTORS

Michael Rice
David W. Groechel
Jim Cruse
Kenneth S. Collins

BACKGROUND

1. Field of Invention

The invention relates generally to plasma processing of mass produced devices such as integrated circuits. The invention relates more specifically to the problem of maintaining repeatable plasma chemistries during repeated executions of a given plasma-processing recipe. The invention relates yet more specifically to high-density plasma (HDP) processes for oxide etching wherein so-called consumable scavenger-emitting kit parts are employed.

2. Cross Reference to Related Applications

The following U.S. patent applications are assigned to the assignee of the present application, are related to the present application and their disclosures are incorporated herein by reference:

(A) Ser. No. 08/138,060 [Attorney Docket No. AM603] filed Oct. 15, 1993 by M. Rice et al and entitled, PLASMA ETCH APPARATUS WITH HEATED SCAVENGING SURFACES;

(B) Ser. No. 07/984,045 [EPO Pub. No. 0601468A1, Attorney Docket No. AM400] filed Dec. 1, 1992 by K. Collins et al and entitled, PROCESS AND ELECTRO-MAGNETICALLY COUPLED PLANAR PLASMA APPARATUS FOR ETCHING OXIDES;

(C) Ser. No. 07/941,507 [EPO Pub. No. 0552491A1, Attorney Docket No. AM306-2] filed Sep. 8, 1992 by K. S. Collins et al. and entitled, PLASMA ETCH PROCESS;

(D) Ser. No. 07/824,856 filed Jan. 24, 1992 by K. S. Collins et al; and (E) Ser. No. 07/722,340 [Attorney Docket No. AM306] filed Jun. 27, 1991 by K. S. Collins et al.

3. Description of Related Art

In the mass production of semiconductor integrated circuits (IC's) and the like (e.g., integrated optical devices, micromachines, etc.) it is generally desirable to maintain precisely repeatable results from one wafer or other workpiece to the next.

To achieve such repeatability it is generally desirable to maintain substantially similar proportionalities of chemical mixtures and substantially similar reaction rates within chemical process steps from one wafer or other workpiece to the next.

One process that calls for precise repeatability of chemistries and rates is a plasma etching step wherein oxide layers such as those composed of silicon dioxide and found on silicon-based integrated circuit wafers are selectively etched by a chemically reactive plasma.

In one such form of oxide etching, a high-density plasma (HDP) is used for carrying out reactive ion etching (RIE) of mask-exposed surfaces.

HDP etching is characterized by a relatively-expansive plasma cloud that extends throughout the reaction chamber rather than being constrained to the vicinity of a workpiece surface.

The ubiquitous nature of the HDP cloud is sometimes exploited to provide enhanced chemical selectivity through the use of so-called 'hot consumable plasma-interactive parts'. In fluorine-based oxide etching for example, the plasma-interactive parts are sometimes referred to as 'scavenger-emitting parts'. Such scavenger-emitting parts interact with an impinging plasma and alter the chemical balance of the plasma in favor of etching away certain targeted oxide materials as opposed to undesired etching away of other materials.

The underlying technology behind scavenger-emitting parts is detailed in the above-cited U.S. application Ser. No. 08/138,060.

In brief, silicon-containing 'scavenger-emitting parts' composed of quartz (silicon dioxide) or other silicon-containing materials (e.g., monocrystalline silicon) are installed within and lining the interior of the plasma reaction chamber. When heated by an impinging plasma, the scavenger-emitting parts emit molecularly-unbound silicon particles from their surfaces at temperature-related rates.

The heat-released silicon particles enter the plasma cloud as 'scavengers' and chemically combine with some of the halogen radicals, such as free fluorine radicals (e.g., $F^-$, $F^0$), that happen to be present within the cloud at the time.

This chemical capture mechanism works to advantageously reduce the number of free halogen radicals present within the plasma etch cloud and to thereby shift the proportionalities of chemicals found within the plasma cloud in favor of non-halogens.

Although it is often desirable to have a limited number of free-halogen radicals (e.g., $F^-$) within an etch plasma, high concentrations of such free-halogen radicals tend to attack undiscriminatingly. They etch away nontargetted materials (e.g., oxygenless layers such as those composed of mono or polycrystalline silicon) instead of selectively etching away only the targeted materials (e.g., oxygen-containing dielectrics such as silicon dioxide). Hence, excessive amounts of free-halogen radicals are undesirable.

If the free-halogen radicals of an etch plasma are mixed in appropriate proportions with other reactive agents such as the fluorocarbon radicals, $CF_3^+$ or $CF_3^0$ for example, the resulting plasma becomes more selective for etching away silicon dioxide and other oxygen containing materials as opposed to oxygenless materials.

In addition to the 'scavenger-emitting' types of plasma-interactive parts, there are other alternate or supplementary types of 'hot parts' that may be used for interacting with the plasma and altering mixture proportions within the plasma.

An example of an alternate such part would be a block of organic material such as Teflon™ that is placed in the plasma chamber to emit carbon particles into the plasma cloud when attacked by fluorine. The released carbon works to increase the amount of $CF_3$ in the plasma cloud relative to free F radicals.

The scavenger-emitting and other types of plasma-altering hot parts are generically referred to herein as 'plasma-interactive parts'.

As explained initially, it is desirable to maintain highly repeatable results from one wafer to the next in the mass production of semiconductor-based integrated circuits (IC's) and the like.

It has been found that the emission rate of each plasma-interactive part (e.g., each scavenger-emitting part) within a plasma chamber is sensitive to the localized temperature of that plasma-interactive part during plasma-processing. Thus as the part's temperature changes, the rate of scavenging or other interaction with the plasma changes. And consequentially, the chemical make up and selectivity of the plasma that is acting on an under-process workpiece changes.

Also, it has been found that certain condensable components of the plasma tend to condense on surfaces of the plasma-interactive parts if the part temperatures are below respective vaporization temperatures of such components. The condensates reduce the plasma-interactive surface area of the plasma-interactive parts.

By way of example, when scavenger-emitting parts in an HDP etch chamber remain below certain temperatures, carbonaceous components of the plasma tend to condense on the surfaces of the scavenger-emitting parts and thereby reduce the emitting surface area of the scavenger-emitting parts. Such carbonaceous condensation also removes desired organic constituents from the plasma and disadvantageously shifts chemical proportionalities within the plasma in favor of free halogen radicals, thereby creating a less selective etch mixture.

For some types of conveniently located, scavenger-emitting parts such as a silicon chamber roof or a helical-antenna dome (usually made of quartz) of an HDP etch chamber, it is possible to economically provide temperature control by way of circulating fluids or other temperature control means. See for example the above-cited U.S. application Ser. No. 08/138,060.

Unfortunately, the plasma chamber often includes other plasma-interactive parts that are less conveniently situated within the chamber interior and for which there has been heretofore no economically attractive way of maintaining constant temperature. The temperatures of these other plasma-interactive parts (referred to hereafter also as 'floating kit parts') are allowed to float up or down in accordance with localized heating and cooling mechanisms that develop as the related plasma is turned on and off for various lengths of time at various power levels.

In low pressure environments (e.g., 10 milliTorr or less) floating kit parts generally dissipate heat by way of blackbody radiation into the low pressure environment of the plasma chamber.

The floating kit parts each gain heat from the locally adjacent portion of the plasma while plasma-processing (e.g., etching) is in progress but they lose heat through blackbody radiation when plasma-processing ceases. The temperature of each floating kit part at each point in time is a function of local net heat gain or local net heat loss for that kit part as defined by the plasma-processing history.

Heretofore, when highly repeatable etch chemistries and etch rates were desired in scavenger-based HDP dielectric etchers, a plurality of sacrificial or 'dummy' wafers were placed at the front end of each production lot. The HDP etch process was repeatedly carried out on the dummy wafers until steady state temperatures were obtained inside the reaction chamber for floating kit parts. Then the actual production wafers were processed under the pre-established steady state conditions.

Such resort to dummy wafers is disadvantageous in that a portion of the limited number of slots in each cassette full of production wafers is consumed by the dummy wafers. Time, materials, and production resources are disadvantageously consumed while the dummy wafers are used to reach the steady state levels of continuous processing.

Additionally, the up front use of dummy wafers in each lot does not assure that temperature repeatability of kit parts will be maintained for all remaining wafers of the lot. Other events during the processing of a given lot such as unexpected delays in the loading or unloading of wafers into and out of a plasma chamber may temporarily shift the temperatures of the kit parts away from normal steady state levels.

A better technique is needed for providing wafer-to-wafer repeatability with respect to the temperatures of floating kit parts.

SUMMARY OF THE INVENTION

The above-mentioned problems are overcome in accordance with the invention by using a chamber-internal warm-up plasma to heat floating kit parts during time periods when a predefined plasma-processing recipe is not executing within the chamber.

The out-of-recipe warm-up plasma is used to maintain the respective temperatures of respective floating kit parts within respective, predefined goal temperature ranges during time periods when a predefined plasma-processing recipe is not executing.

Additionally or alternatively, the out-of-recipe warm-up plasma is used to raise the temperatures of floating kit parts to respective, predefined goal temperature ranges prior to execution of a predefined plasma-processing recipe.

The term 'plasma-processing recipe' is taken here to mean a specified combination of plasma input power magnitudes, plasma input gases and plasma-on durations that are to be used during the processing with plasma of a supplied wafer or other workpiece for transforming the wafer/workpiece into a plasma processed wafer/workpiece.

The predefined goal temperature ranges that are to be attained for each floating kit part through the use of the out-of-recipe warm-up plasma, and the tolerances of the goal temperature range specified for each floating kit part, may vary depending on purpose.

In satisfying a first purpose in accordance with the invention, the goal temperature range for at least one floating kit part is set sufficiently high to prevent undesirable condensates such as carbonaceous condensates from accumulating on plasma-interacting surfaces of the at least one floating kit part. Maintenance of such a first-purpose satisfying, goal temperature range keeps the surface area of the at least one floating kit part substantially clear of undesirable condensates at the start of execution of a next plasma-processing recipe.

In satisfying a second purpose in accordance with the invention, the goal temperature range for at least one floating kit part is set to centrally encompass or closely approximate a respective, steady-state recipe-repeat temperature of that kit part, the steady-state recipe-repeat temperature being one that is attained by the kit part after prolonged exposure to a plasma having a power level which is the same as the average plasma power level associated with uninterrupted repetition of a next to-be executed, predefined plasma-processing recipe. Maintenance of such a second-purpose satisfying, goal temperature range keeps the temperature of the at least one floating kit part substantially near its steady state recipe-repeat temperature at the start of execution of the predefined plasma-processing recipe. Repeated maintenance of such a second-purpose satisfying, goal temperature range prior to each execution of a succession of executions of the predefined plasma-processing recipe provides for similar emission rates for that at least one floating kit part in each of the succession of executions of the predefined plasma-processing recipe.

In satisfying a third purpose in accordance with the invention, the goal temperature range for at least one floating kit part is set slightly above or substantially close to a respective long-term equilibrium temperature (LTET) of the at least one floating kit part. The LTET temperature is one that is attained by the kit part after prolonged exposure to a plasma having a power level which is the same as a particular plasma-processing power level (e.g., a main etch level) specified within a predefined plasma-processing recipe. The third-purpose satisfying, goal temperature range is set such that the at least one floating kit part will be continuously at or substantially close to its respective long-term equilibrium temperature during execution of a portion of the plasma-processing recipe calling for the particular plasma-processing power level. Because the at least one floating kit part will be at or substantially close to its heat gain versus heat loss equilibrium state during the execution of that portion of the plasma-processing recipe calling for the particular plasma-processing power level, the temperature of the kit part will remain substantially or approximately constant during that time period. Repeated maintenance of such a third-purpose satisfying, goal temperature range prior to each execution of a succession of executions of the predefined plasma-processing recipe provides for substantially same, constant emission rate for that at least one floating kit part in each of the succession of executions of the predefined plasma-processing recipe.

Irrespective of the one or more purposes being satisfied by use of the warm-up plasma to heat floating kit parts during time periods when a predefined plasma-processing recipe is not executing within the chamber, it is a further aspect of the invention to use an out-of-recipe warm-up plasma that is composed mostly of one or more relatively nonreactive gases such as argon, helium, neon and/or nitrogen. The relatively nonreactive gases are characterized as ones that do not remove at a substantial rate, the bulk material of the floating kit parts.

In addition to the relatively nonreactive gases that define a major portion (as measured by mass flowrate) of the warm-up plasma, the out-of-recipe warm-up plasma may contain a less than major quantity of a removing agent such as oxygen that works to remove undesirable condensates from the kit part surfaces without consuming substantial quantities of bulk material from the kit parts. In one embodiment, the warm-up plasma is a mixture of approximately 75% argon and approximately 25% oxygen as measured by mass flowrate.

A structure in accordance with the invention comprises: (a) warm-up plasma creating means for igniting and/or maintaining a relatively inert warm-up plasma within a reaction chamber during times when a predefined plasma-processing recipe for a given succession of workpieces is not being continuously repeated within the chamber, the warm-up plasma being created for the purpose of keeping chamber-internal kit parts warmer than such kit parts otherwise would be if the warm-up plasma had not been created; and (b) control means for determining when the warm-up plasma should be turned on, for how long, and at what power level.

A plasma chamber maintaining method in accordance with the invention comprises the steps of: (a) defining a goal temperature below which it is undesirable for the respective temperatures of one or more plasma-interactive kit parts to drop during a given non-recipe time period, the non-recipe time period being a time period in which the plasma chamber is not continuously executing successive plasma process operations in accordance with a predefined plasma-processing recipe; and (b) during the given non-recipe time period, maintaining a warm-up plasma within the plasma chamber at a power level sufficient for keeping the respective temperatures of the one or more plasma-interactive kit parts equal to or greater than the goal temperature. The goal temperature is preferably greater than a condensate temperature at which condensable components of the process plasma tend to condense on kit part surfaces.

The goal temperature is even more preferably substantially near or equal to a steady state average temperature associated with successive repetition of the predefined plasma-processing recipe.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
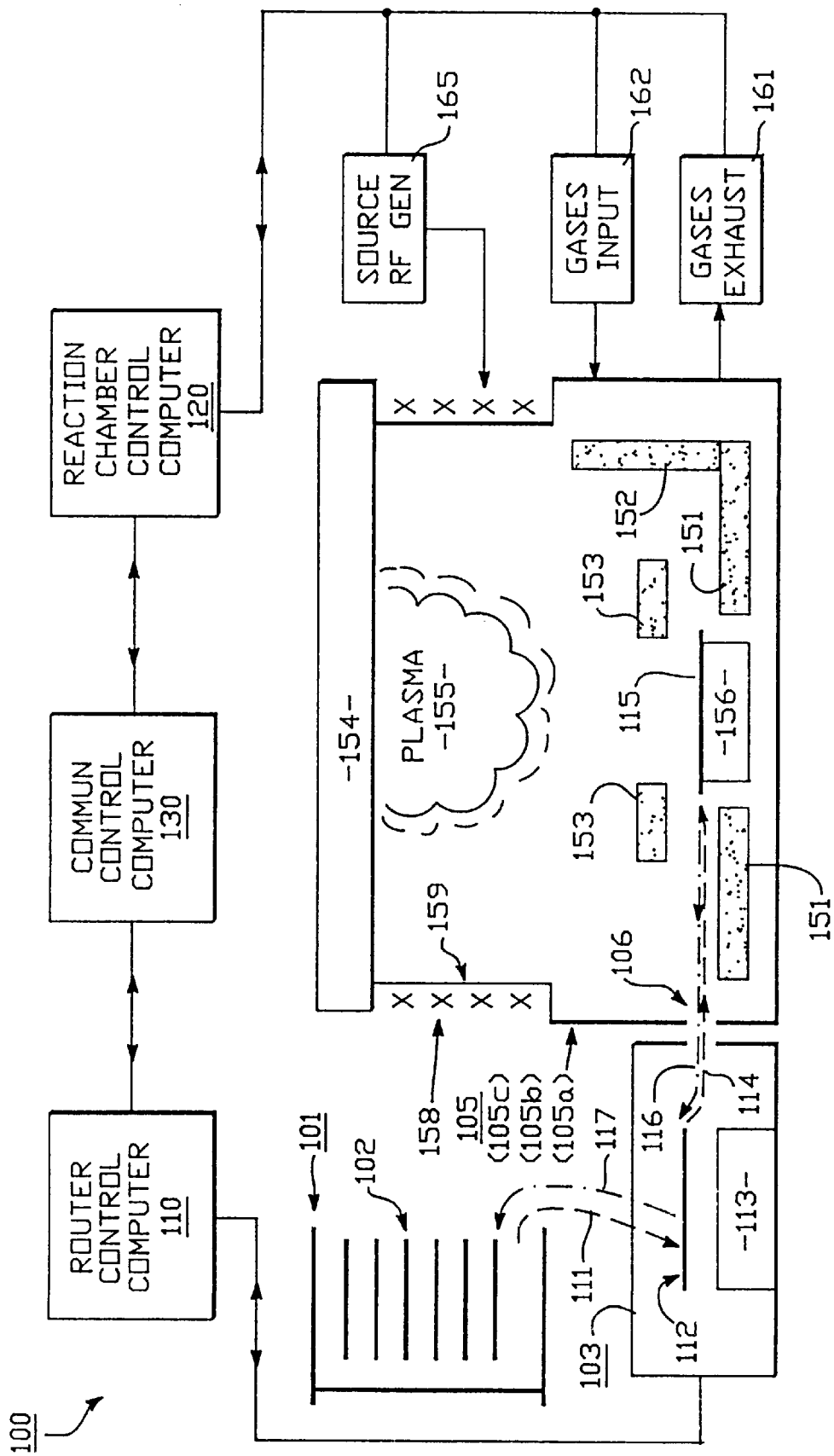
FIG. 1 is a cross-sectional schematic of a high density plasma (HDP) processing system that may be used in accordance with the invention.

FIG. 1 is a cross-sectional schematic of a high density plasma (HDP) processing system 100 that may be used in accordance with the invention. In one embodiment, the hardware of system 100 is constituted by an Applied Materials Centura™ HDP Dielectric Etcher available from Applied Materials of Santa Clara, Calif.

System 100 includes a vertically-reciprocatible cassette 101 filled with a plurality of silicon wafers 102 or other workpieces that are to plasma-processed (e.g., plasma-etched). The cassette 101 is removably inserted into the system 100. The workpieces 102 are thereafter automatically removed from the cassette, plasma processed, returned to the cassette, and upon completion the cassette 101 is removed to make way for a next cassette full of wafers.

A cluster router (or transfer tool or transfer robot) 103 is provided for robotically moving the wafers/workpieces between the cassette 101 and either one or an attached cluster of processing chambers. In a non-clustered embodiment there is only one HDP chamber to be loaded via transfer tool 103. In a clustered embodiment there are two or more high-density plasma (HDP) processing chambers 105a–105c each of which is loaded and unloaded with wafers by way of cluster router 103.

Each one plasma chamber of a non-clustered embodiment or each of the two or more HDP chambers 105a–105c of a clustered embodiment is generically referred to herein as an HDP chamber 105.

The transfer tool of the non-clustered embodiment and the cluster router of the clustered embodiment are similarly, generically referenced to as a router 103.

System 100 further includes a router control computer 110 for controlling the router 103, and one or more reaction chamber control computers 120 each for controlling a respective HDP reaction chamber 105 (and more specifically for controlling one or more of elements 161, 162 and 165 of the respective HDP reaction chamber).

A communications control computer 130 is provided operatively coupled to the router control computer 110 and to the one or more reaction chamber control computers 120 for coordinating and controlling message exchanges between the router control computer 110 and the one or more reaction chamber control computers 120. (Only one of the latter is shown.)

The communications control computer 130 may have an operator interface panel (not shown) that includes a number of operator control means (e.g., push buttons) for allowing an operator to start, stop and restart automated handling and plasma-processings of wafer/workpieces.

In one embodiment for example, after the operator has inserted a new batch of one or more cassettes 101 into the plasma-processing system 100, the operator presses a 'LOAD' button that causes the system 100 to inload one or more new plasma-processing recipes and to begin automated wafer transfer and automated execution of the new plasma-processing recipe/recipes on the just loaded wafers. If for some reason the operator wants to stop the automated process, the operator presses a 'STOP' button that causes the system 100 to stop further wafer transfers and to halt further plasma-processing within each plasma chamber 105 after that respective chamber has finished execution of any then executing, wafer-in-chamber portion of a then executing recipe. If the operator thereafter wants to restart the stopped process, the operator presses a 'AUTO-RUN' button. In response, the system 100 tries to continue forward from where it was last left when the 'STOP' button was pressed.

Although the illustrated embodiment of FIG. 1 implies three or more separate computers, 110, 120, 130 for carrying out the functions of router control, plasma-chamber control and router-to-plasma chamber coordination, it is within the contemplation of the invention to have two or more of these functions integrally carried out by a common computer or even by dedicated hardware. In some instances one or two of these functions may be dispensed with such as when wafers are manually rather than automatically loaded into and unloaded from chambers. A wide variety of implementations are possible as will be apparent to those skilled in the art in view of the present disclosure.

Additionally, although the illustrated embodiment of FIG. 1 implies that wafers or other workpieces 102 are successively processed one cassette full at a time, it is within the contemplation of the invention to have multiple cassettes being simultaneously processed by a same plasma-processing system or to have successive wafers/workpieces automatically delivered to the one or more plasma chambers in a wide variety of ways other that shown.

The mass production movement of silicon wafers 102 or other workpieces through system 100 typically proceeds as follows.

The vertically-reciprocatible cassette 101 is inserted into the system 100, load-locked, and stepped up or down to a pre-specified vertical position. A corresponding wafer is then removed horizontally from the cassette 101 and robotically transferred into router 103 as indicated by a first dashed-line flow path 111. The in-router wafer is designated as 112.

A router-internal orienter 113 orients the in-router wafer 112 for subsequent loading into a preselected HDP reaction chamber 105. (Orientation generally includes the substep of positioning a flat edge of the wafer at an appropriate angle relative to the position of the preselected HDP chamber.)

The pressure within router 103 is first reduced to approximately match a lower pressure within the preselected HDP chamber 105. Then a corresponding slit valve 106 is opened to create a second flow path 114 (dashed line) into the preselected HDP chamber 105. The pre-oriented wafer 112 is moved along this second flow path 114 by a horizontally reciprocating blade (not shown) and placed onto an electrostatic or other type of wafer-holding chuck 156 that provides a temporary wafer-clamping function. The in-chamber wafer is now designated as 115.

After the wafer loading, slit valve 106 is closed and the pressure within the reaction chamber 105 is further reduced by a throttled turbopump or other pump means 161 (also referred to as a gas exhaust means 161). The pressure within the HDP chamber 105 is typically reduced to 10 milliTorr or less, and more preferably to approximately 4 milliTorr or less.

Plasma gases are next flowed into chamber 105 from a gas selection and input means 162. The input gases that are provided by means 162 can include a selected one or a selected mixture of gases such as argon (Ar) or other inert gases of period VIII of the periodic table (He, Ne, Kr, Xe), nitrogen (N), oxygen (O) and various fluorocarbons such as $CF_4$. The specific gas or mixture of gases, and its/their mass flowrates and the duration of input for a particular gas or combination of gases is controlled by the respective reaction chamber control computer 120. The gas exhaust means 161 is typically commanded by the reaction chamber control computer 120 to continue to operate so as to maintain a prespecified low pressure within the HDP chamber 105 while the input gases are flowed into the chamber from the gas selection and input means 162.

A first RF energy source 165 (e.g., a high-energy RF generator operating at for example 2 MHz to 13.56 MHz, 2 MHz being the preferred frequency for HDP oxide etching) is then energized in response to a command sent from the reaction chamber control computer 120 to ignite and thereafter maintain a high-density plasma 155 (shown as an expanding cloud) within the HDP chamber 105. In one embodiment, the source energy of generator 165 is inductively coupled into the interior of the reaction chamber 105 by means of a helical coil antenna 158 (represented in cross section as X's) that surrounds a quartz dome 159. The base and sidewalls of remaining interior parts of the HDP chamber 105 are often made of aluminum and are further lined by so-called, plasma-interactive parts as will be explained. Reaction chamber control computer 120 can be programmed to select the ignite time point, the power level, and the duration of each energization of the RF energy source 165.

One or more other RF energy sources (e.g., a so-called 'base' or 'pedestal' or 'bias' RF of approximately 400 kHz to 1.8 MHz, not shown, with 1.8 MHz being the preferred frequency for HDP oxide etching) are further coupled to the plasma and turned on or off at selectable power levels by the reaction chamber control computer 120 so as to anisotropically extract reactive ions from the high-density plasma 155.

The extracted reactive ions (e.g., F– and $CF_3^+$) bombard the workpiece surface and work to etch away mask-exposed portions of the workpiece surface. These other RF energy sources are not directly relevant to the present invention because they do not substantially affect the temperatures of kit parts that are located outside the anisotropic excitation paths of the bias RF. Thus, the one or more other RF energy sources are not shown.

The source plasma 155 fills the interior of the reaction chamber 105 and serves as a source of the free radicals (e.g., F, $CF_3$) that react with exposed surface portions of wafer 115. Reaction byproducts are removed by the gas exhaust means 161.

After a plasma reaction such as etching or oxidizing is carried out for a desired length of time at desired power levels, the source RF generator 165 is turned off (as are the other not shown RF generators). The HDP chamber is then optionally repressurized with an inert gas (e.g., argon) supplied from gas input means 162 if the pressure in the router 103 is higher. The slit valve 106 is opened, and the plasma-processed wafer 115 is unloaded from the HDP chamber along a first return path 116 (dash-dot line) that takes the wafer back to the router 103.

The in-router wafer (now re-designated as 112) is reoriented by orienter 113 for return into cassette 101 and thereafter the reoriented wafer is returned along second return path 117 into its corresponding slot in cassette 101. Return paths 116 and 117 are drawn as dash-dot lines to distinguish them from the dashed lines of forward paths 111 and 114.

In a cluster-based embodiment, there are generally two or more HDP chambers such as 105 surrounding a single router 103. In one embodiment there are three such HDP chambers surrounding a single router 103. The three HDP chambers are designated herein as 105a, 105b and 105c. For purposes of illustrative simplicity, only the one generic HDP chamber 105 is shown.

Plasma reactions are preferably time staggered in a cluster-based system so that the router 103 will be loading a fresh new wafer into a first HDP chamber 105a while at the same time execution of a predefined plasma processing recipe is approaching completion in a second HDP chamber 105b and while at the same time execution of the same or another plasma processing recipe has begun in a third HDP chamber 105c. Then, as plasma processing begins in the freshly-loaded first HDP chamber 105a, the router is ready to unload the plasma-processed wafer of second HDP chamber 105b, and reload the second HDP chamber 105b with a fresh, not-yet processed next wafer 102. This time staggered procedure repeats round-robin style around the cluster of HDP chambers.

When viewed over time from the internal vantage point of a given HDP chamber 105, the movement of wafers 115 into and out of the given chamber 105 is rarely uniform. A number of events may occur within either a non-clustered or a cluster-based system 100 to produce non-uniformities of wafer flow into and out of the given HDP chamber 105.

First, each HDP chamber 105 may sit idle while a finished cassette 101 of wafers is removed from etching system 100 and a new cassette of unprocessed fresh wafers is inserted.

Then, because the router 103 can only load one wafer at a time, in the cluster-based system, the not-yet-loaded chambers 105b, 105c of such a system may remain idle (not in a recipe executing state) while the router 103 begins its workpiece transfer process indicated by first and second flow paths 111, 114.

A similar condition may develop at the end of a processing of a cassette 101 of wafers 102. While a last of the reaction chambers 105c finishes processing the last wafer 115 of a to-be-removed cassette 101, the other already-unloaded HDP chambers 105a, 105b may end up sitting idly by.

During the robotic transfer of a given wafer 102 between the cassette 101 and a respective HDP chamber 105 (or other chamber of the cluster, e.g. a mask ashing chamber), problems may develop along the wafer transfer paths, 111, 114, 116, 117. The router and reaction chamber control computers 110 and 120 may be able to automatically overcome such problems, but the wafer transfer problems nonetheless randomly insert delays into the operations of the system 100. These delays may introduce additional idle times for one or more of the HDP chambers 105a–105c.

As explained above, in the case of HDP oxide etching or other types of plasma-processing, it may be advantageous to include so-called plasma-interactive parts (such as scavenger-emitting parts 151–154 and 159, described below) within each plasma chamber 105. Scavenger-emitting parts (151–154, 159) emit scavenger particles such as silicon radicals that enter the plasma cloud 155 and seek out and remove excess amounts of non-selective moieties such as fluorine (F) from the plasma cloud 155. This alters the chemical make up of the plasma cloud 155 and makes the plasma cloud 155 more selective for etch removal of a desired material layer (e.g., silicon oxide) of the under-process wafer 115.

Because the HDP plasma cloud 155 extends substantially throughout the interior of the reaction chamber 105, it is advisable to place scavenger emitting or other plasma-interactive parts in a number of different locations within the interior of the reaction chamber.

Some of scavenger-emitting parts such as the quartz dome 159, and a crystalline silicon roof 154, are conveniently situated such that their temperatures can be controlled by external heating and/or cooling means. For more details regarding this aspect, see for example the above-cited U.S. application Ser. No. 08/138,060 of M. Rice et al, entitled PLASMA ETCH APPARATUS WITH HEATED SCAVENGING SURFACES.

Others of the scavenger-emitting parts are so-called 'floating kit parts' (151–153) that are not conveniently situated for external temperature control.

The cross-sectional view of FIG. 1 shows a first such floating kit part, a scavenger emitting ring 151, placed on the floor of the HDP chamber. A second such kit part 152 is provided as a liner about aluminum side walls of the HDP chamber. (To avoid illustrative clutter, only a portion of second kit part 152 is shown in FIG. 1.) A ring-shaped third kit part 153 is provided about the wafer-holding chuck 156, outside the effective field of the bias RF. The scavenger-emitting kit parts 151–153 are preferably made in this case of a silicon-containing material such as quartz.

More generally, the plasma-interactive floating kit parts can be made of one or more scavenger-emitting materials that remove certain undesirable chemicals from the plasma. The plasma-interactive floating kit parts can be alternatively or additionally made of one or more, to-the-plasma contributing materials that add certain desirable chemicals to the plasma.

In the case of selective oxide etching for example, each of the plasma-interactive floating kit parts can be made of one or more materials such as Si, $Si_3N_4$, SiC, C, $SiO_2$, polyimide, Teflon™, $Al_2O_3$, and so forth. Note that a material such as silicon carbide (SiC) functions to emit scavenger particles (Si) and to also emit to-the-plasma contributing materials (C). The emitted carbon particles shift the mixture balance within the plasma in favor of selective moieties such as $CF_3$.

Over the course of repeated plasma reactions, the scavenger-emitting kit parts 151–153 lose their material to the plasma. As such, the scavenger-emitting kit parts 151–153 need to be periodically replaced. The replacement parts usually come in the form of kits. Pieces 151–153 are therefor referred to as 'consumable kit parts'. (The quartz dome 158 and silicon roof 154 also need to be periodically replaced, but usually according to a different maintenance program than that of the kit parts 151–153.)

The rate at which each floating kit part such as 151–153 emits its respective scavenger or other particles depends substantially on the local temperature conditions of that specific kit part 151–153 at each point in time. Because each kit part 151–153 is positioned differently with respect to the plasma cloud 155, each kit part 151, 152, and 153 exhibits a unique temperature versus time profile.

As explained above, the temperature of each floating kit part is a function of local net heat gain or net heat loss. During the idle, recipe not-executing time of a given plasma chamber 105, the corresponding kit parts 151–153 lose heat primarily by way of blackbody radiation and thus the respective temperatures of the kit parts drop.

During plasma-etching of wafers (or other within-recipe energizations of the plasma), the corresponding kit parts 151–153 gain heat primarily by way of energy absorption from the plasma 155 and during that time the temperatures of the floating kit parts 151–153 climb. If a given recipe is repeated for a long enough time without interruption, the heating and cooling mechanisms will tend towards some form of equilibrium wherein kit part temperatures generally oscillate within a limited band of temperatures.

Figure 2:
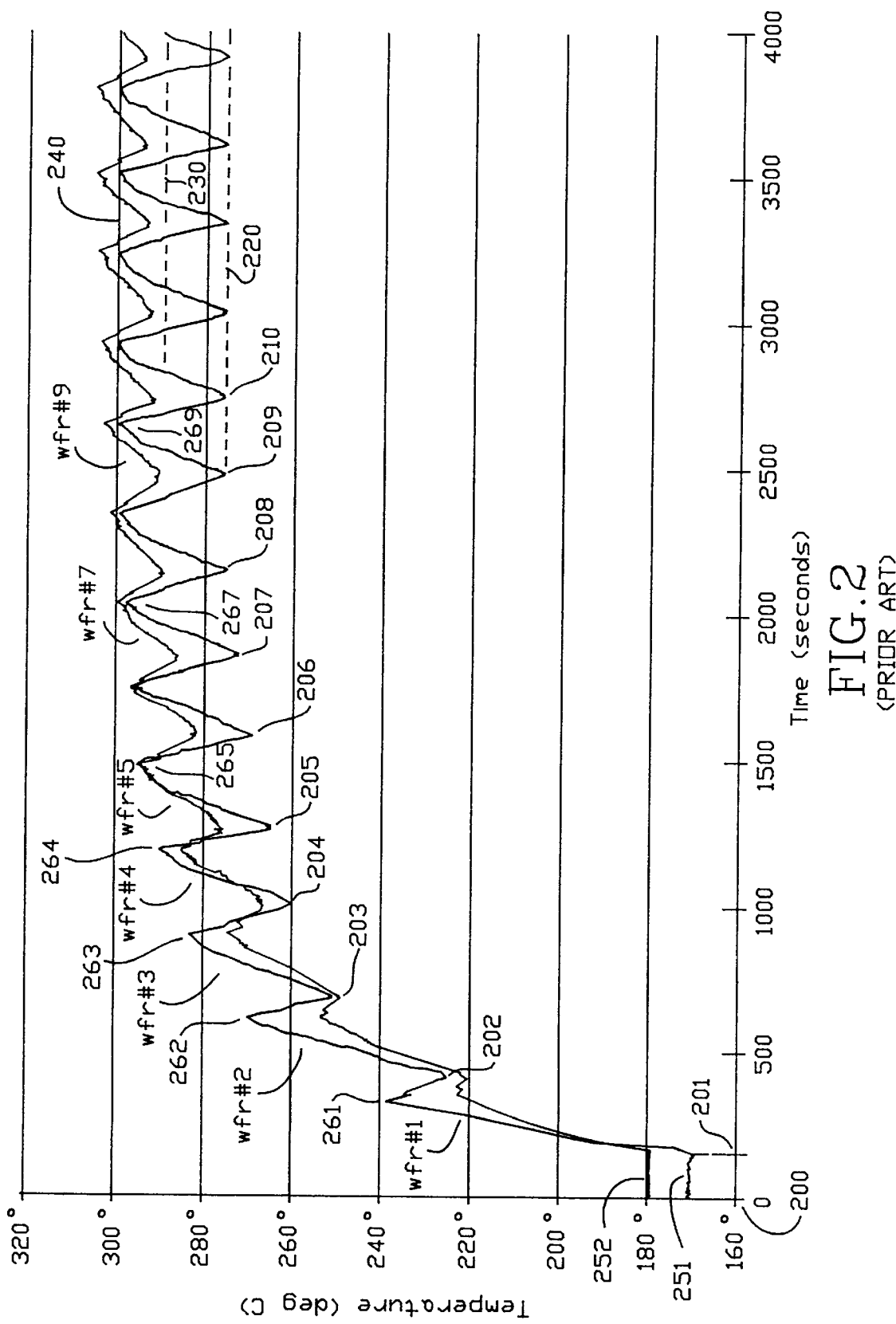
FIG. 2 is a temperature versus time plot showing a previous method for reaching steady-state continuous production conditions.
Figure 4A:
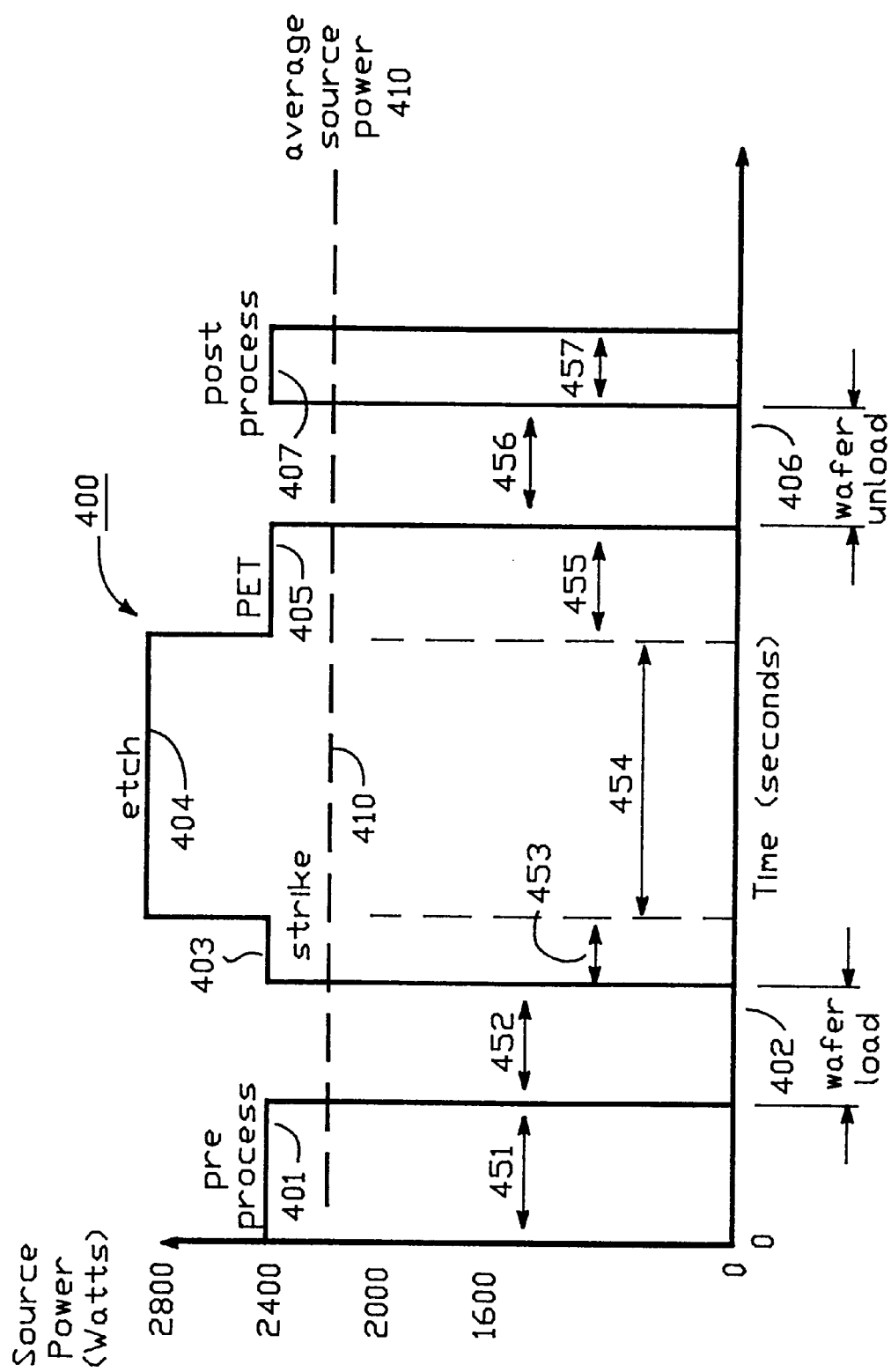
FIG. 4A shows a sample process recipe for explaining how average source power per recipe may be determined.

FIG. 2 shows the results of temperature measurement experiments carried out during the processing within one HDP chamber 105 of a cassette of wafers in a non-clustered operating mode. The experiments used a consistent plasma processing recipe from one wafer to the next. All wafers were routed to a single HDP chamber so that clustering related delays were not introduced. All wafers were plasma etched according to a same 140 second long etch-recipe. This 140 second long etch-recipe did not have a preprocess subportion 401 or a post-processing subportion 407 such as shown in FIG. 4A.

The plots of FIG. 2 are in terms of temperature (°C) versus time (seconds). The bolder plot 251 represents the measured temperature profile of the base-plate kit part 151. The thinner plot 252 represents the measured temperature profile of the sidewall-liner kit part 152.

The plots of FIG. 2 were taken in the middle of a succession of cassette runs. Thus, at the time point 200 (0 seconds on the clock) of the initial plot points, the kit parts have some amount of residual warmth, which is why the plots start above 160° C. If more time had been taken between cassette runs, the respective temperatures of the floating kit parts would have decayed towards room temperature.

One thing not shown in FIG. 2 but worthwhile noting is that a net increase in accumulated carbonaceous condensation on the surfaces of kit parts such as 151 has been observed upon re-ignition of the etching plasma in cases where the plasma was left off for long enough a time to let kit part temperatures drop below approximately 180° C. This accumulation of carbonaceous condensate essentially reversed and disappeared on kit part surfaces once their respective temperatures rose above approximately 180° C. (It is to be understood that the stated 180° C. value is not absolute. The specific condensation temperature point at which carbonaceous components stop accumulating and begin to evaporate off of kit part surfaces can vary with changes in the respective compositions of either the plasma or the kit part surfaces.)

At time point 201 of FIG. 2, a first wafer (wfr#1) has been loaded into the HDP chamber and the plasma has been turned on in accordance with the recipe. The rate of heat contribution from the applied plasma exceeds the rate of heat loss due to blackbody radiation, and thus the temperature for the base kit plate 151 rises during the processing of wfr#1.

In the plasma-processing of wfr#1, the temperature for the base kit plate 151 peaks at plot point 261, just under 240° C. Note that part of the plasma-processing of wafer wfr#1 occurs in the temperature range below 180° C. This implies that carbonaceous condensates may have been covering the surface of the base kit plate 151 at least during the sub-180° C. phase of processing between points 201 and 261 if not longer.

A similar rise of temperature during the same time period (between points 201 and 261) is seen for plot 252 of the temperature profile of the side wall liner 152.

Between plot points 261 and 202, the etching plasma has been turned off, the first wafer (wfr#1) is unloaded and the second wafer (wfr#2) is newly loaded. Temperature loss for the kit parts is believed to be primarily due in this time frame to blackbody radiation from the kit parts 151–152 into the low pressure environment of the HDP chamber. A similar but less pronounced drop of temperature during the same time period is seen for plot 252 of the temperature profile of the side wall liner 152.

Between plot points 202 and 262, the plasma 155 has been again turned on to process the second wafer (wfr#2) and the respective temperatures of the kit parts 151–152 climb as a result of plasma input power exceeding the rate of heat loss due to blackbody radiation. This time the kit part temperatures reach new peaks (e.g., 262) higher than their respective previous peaks (e.g., 261).

Between the times of plot points 262 and 203, the plasma is again turned off, the second wafer is unloaded, a third wafer (wfr#3) is loaded into the HDP chamber, and the respective temperatures of the kit parts again drop as a result of blackbody radiation over time.

The repetitive operations of plasma turn-off, wafer unload, new wafer load and plasma turn-on are continued without interruptions (as indicated by respective plot portions 203-263-204-264-205-265-206-etc.) until, as seen beginning at approximately plot point 209 (the start of plasma-processing for wafer wfr#9), a steady state oscillatory condition is obtained for the temperatures of the kit parts on a wafer-to-wafer basis.

The steady state oscillatory condition for plot 251 (the temperature profile of kit part 151) may be characterized as having a steady state baseline temperature level 220 below which the kit part temperature does not generally drop, a ceiling temperature level 240 (the 300° C. line) above which the kit part temperature does not generally rise, an average steady state temperature level 230 and a specific waveform (generally, an inverted V-shaped waveform).

It is desirable to maintain etch conditions that are substantially identical for each wafer of a mass production run so that repeatable results may be obtained during mass production of integrated circuits.

One way of reproducing substantially identical etch conditions with respect to scavenger chemistry is by trying to maintain at least an essentially same, respective baseline temperature level (e.g., 220) for each respective kit part on a wafer-to-wafer basis; and more preferably trying to also maintain an essentially same, respective average temperature level (e.g., 230) for each respective kit part on a wafer-to-wafer basis; and yet more preferably trying to further maintain an essentially same, respective ceiling temperature level (e.g., 240) for each respective kit part on a wafer-to-wafer basis; and yet even more preferably trying to further maintain a roughly same, respective temperature profile waveform for each respective kit part on a wafer-to-wafer basis.

The experimental results of FIG. 2 show that the kit-part baseline, ceiling and average temperatures for at least the first four wafers (wfr#1–wfr#4) of each lot are substantially different than those of the wafers near the end of the lot (wfr#9 and on). This indicates that the corresponding etch chemistries are also different because of the temperature dependency of the emission rates of the floating kit parts.

It has been proposed that the first, roughly four or more wafers (wfr#1 to wfr#4 or beyond), be considered as sacrificial or 'dummy' wafers and discarded from the production stream in order to obtain better repeatability of etch results across the process lot.

This proposal has a number of drawbacks including a reduction in the number of wafers that may be processed per cassette 101, waste of time and waste of processing materials and resources.

As seen by the experimental results of FIG. 2, after a number such as approximately the first five to nine wafers of a given lot have been processed without interruptions, the temperature profiles of the various kit parts can enter into the long-term equilibrium state wherein, although the instantaneous temperatures do not remain constant over time, the respective temperatures of the various kit parts oscillate about respective steady state average temperature levels (e.g., 230 for plot 251) with substantially same baseline and ceiling temperature levels (e.g., 220 and 240) and with roughly similar waveforms. The plasma-processed wafers are then effectively subject to nearly identical plasma chemistries in so far as the emission of scavenger particles is concerned.

It is one objective of the invention to reach such a long-term equilibrium state for each respective kit part without use of dummy wafers. It is another objective to maintain kit part temperatures above the carbonaceous condensation point of a corresponding organic-material containing plasma (e.g., above approximately 180° C.).

It is a further objective of the invention to reach the long-term equilibrium state in relatively short time and to maintain the long-term equilibrium state despite introduction of random interruptions into the overall run.

Figure 3:
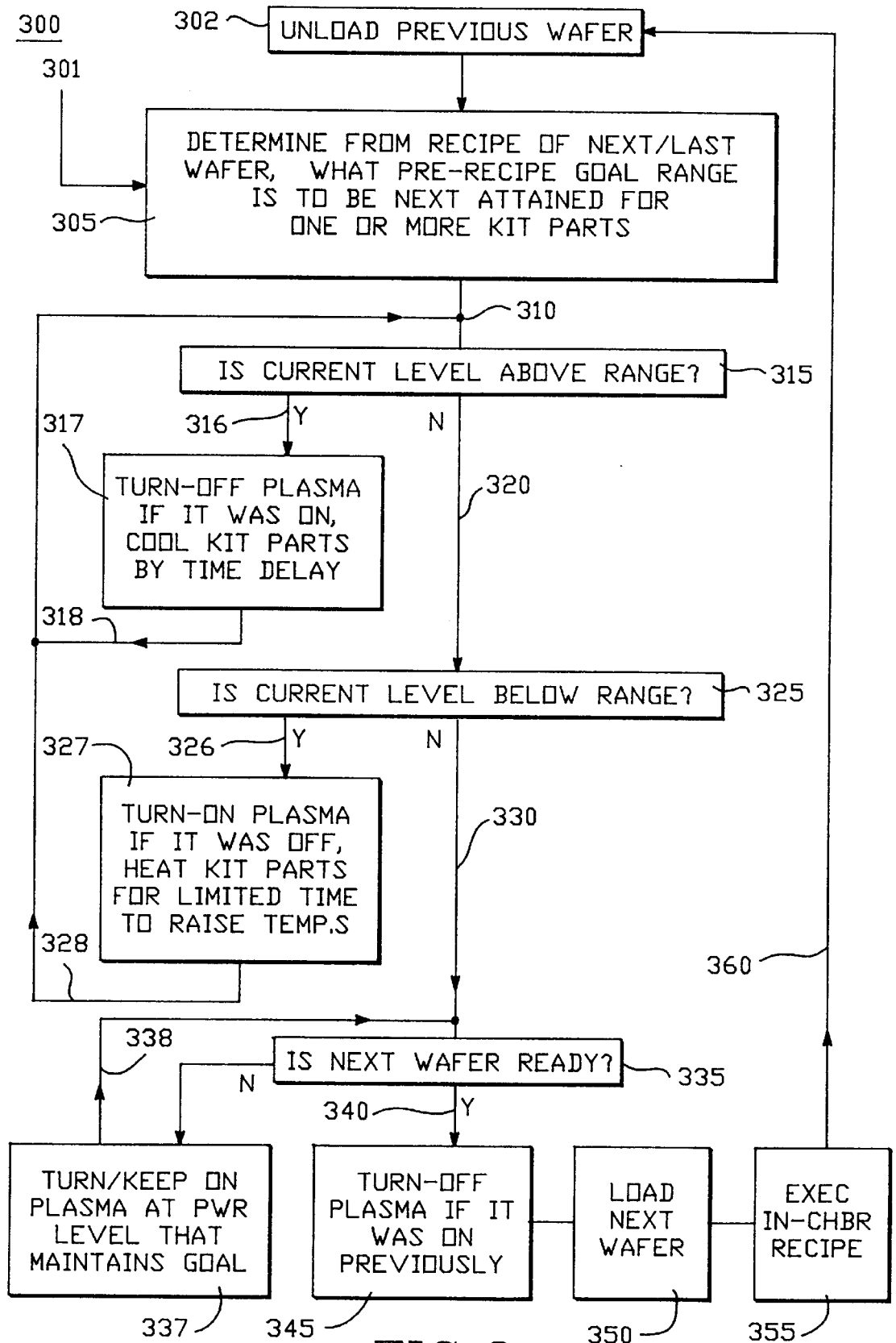
FIG. 3 is a flow chart for a first kit-part temperature maintaining algorithm in accordance with the invention.

FIG. 3 shows a flow chart for a first processing algorithm 300 in accordance with the present invention that may be carried out automatically by computers such as 110–130 of FIG. 1.

One feature of first algorithm 300 is the inclusion of a temperature-increasing step 327 wherein a warm-up plasma (which plasma is preferably composed in bulk of one or more relatively inert gases such as argon or nitrogen) is ignited and/or maintained inside the HDP chamber 105 prior to execution of a predefined plasma-processing recipe. This temperature-increasing step 327 is carried out using a plasma power level that is sufficiently high for raising the respective temperatures of the internal kit parts 151–153 each to a predefined and respective goal temperature range.

Another feature of first algorithm 300 is the inclusion of a temperature-maintaining step 337 wherein a warm-up plasma (which preferably was ignited in temperature-increasing step 327) is kept turned on at a plasma power level that maintains the kit parts within their respective goal temperature ranges.

The goal temperature range of each floating kit part under consideration is preferably above the carbonaceous condensation point of the respective kit part.

The goal temperature range of each such kit part is more preferably, in one embodiment equal to or at least substantially close to an average steady-state temperature (e.g., 230) associated with uninterrupted repetitive execution of a next-to-be or last executed, predefined wafer-processing recipe (e.g., 400 of FIG. 4A).

The goal temperature range of each such kit part is, in another embodiment, slightly above a so-called LTET (long term equilibrium temperature, defined below) of a specific in-recipe power level such as the power level of a fourth subportion 404 of FIG. 4A.

The purposes served by each of these different goal temperature ranges will be described later on. See generally FIGS. 5A–5B for satisfaction of the first two purposes and FIG. 7 for satisfaction of the first and third purpose.

Algorithm 300 is first entered by way of path 301.

At next step 305, a determination is made from the recipe of the next wafer to be processed, what goal range of temperatures is to be attained for one or more of the floating kit parts. If the next to-be executed recipe is not known, the goal range of temperatures to be attained may alternatively be determined from the recipe of the last wafer to be processed. In another alternative, predefined default values are used for the goal range of temperatures that are to be attained by algorithm 300.

In one embodiment, the goal temperature range is preferably restricted to the range of plus-or-minus five percent (+/−5%) of the steady state average temperature attained by repetitive carrying out of the next/last plasma-processing recipe. The goal temperature range is more preferably limited to the range of +/−1.5% of the next/last steady state average temperature and even more preferably to +/−0.5% of the next/last steady state average temperature.

Because steady state temperature and long-term average source power can be correlated to one another, a goal steady state condition may be alternatively defined in step 305 by a long-maintained level of average source power instead of by temperature.

The average level of source power level that defines a given steady state condition is that level of constant plasma power that is required for steady state maintenance of a corresponding goal temperature (or range of temperatures) in view of given other conditions (e.g., ambient temperature, chamber pressure, external sources of heating and cooling, and so forth). The actual temperature does not have to be known.

Figure 4B:
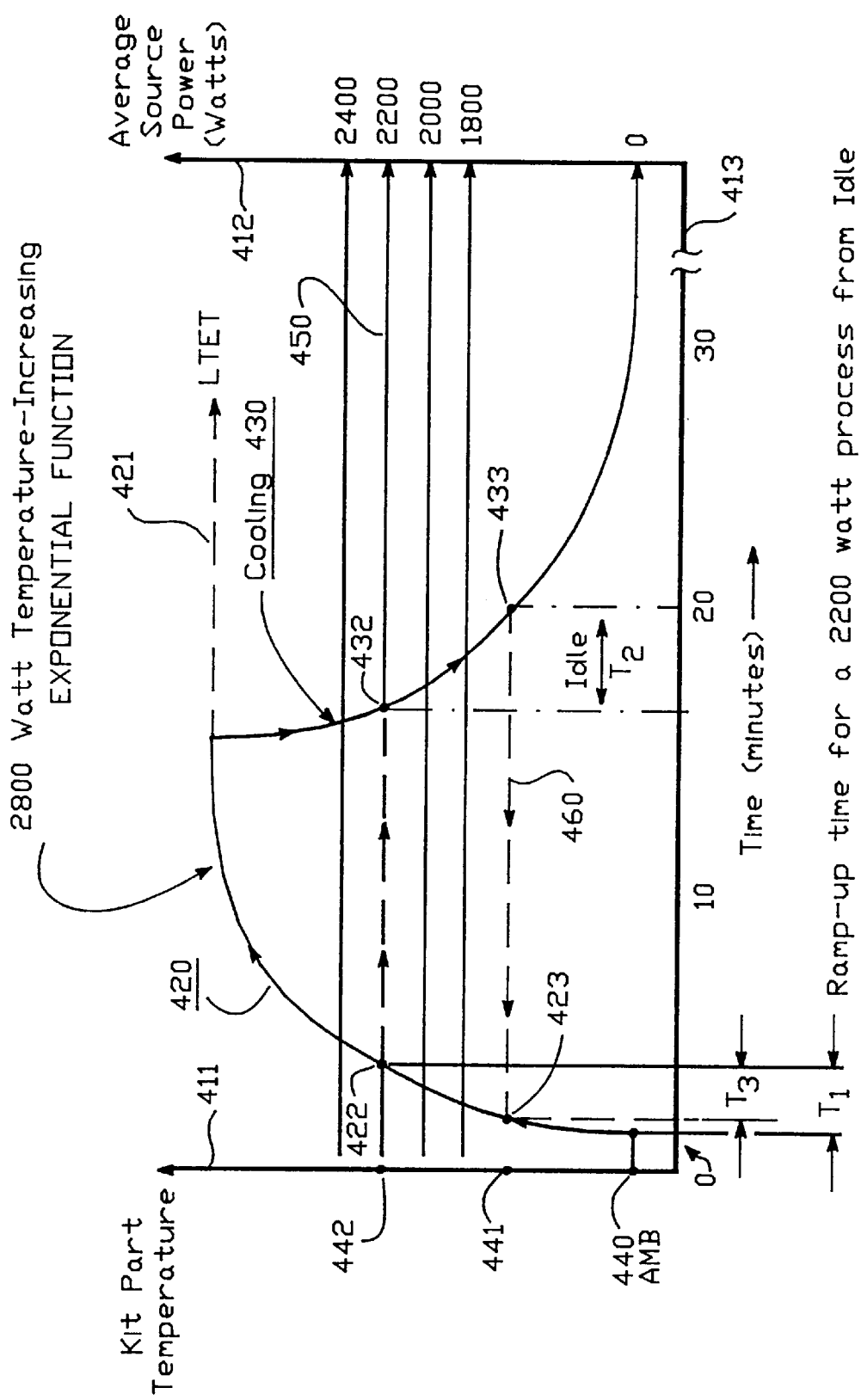
FIG. 4B shows the heat and cool characteristic curves of a sample kit part which may be used for open-loop tracking of the current net energy level (and/or corresponding current temperature) of each kit part due to the heat and cool history of the kit part.

Referring briefly to FIG. 4B note that for each temperature, there is a corresponding plasma power level which, if maintained for a respective, relatively long period of time (which extended length of time is indicated by the rightward pointing arrows next to the power level notations, 1800 W through 2400 W), inherently provides the corresponding (even if perhaps unknown) temperature.

By specifying a power level for a long-term continuously-running plasma (C.P.), one inherently specifies a corresponding steady state temperature for the floating kit parts—assuming that the continuously-running plasma (C.P.) is in fact maintained for long enough a period of time.

An example of how the average source power of a given plasma-processing recipe is used to define a desired power level for a long-term continuously-running plasma (C.P.) is detailed below with respect to FIG. 4A. FIGS. 4A and 4B will be discussed in greater detail below.

Returning to FIG. 3, it should be noted that the goal determining step 305 may be entered into alternatively from an automatic wafer-unload step 302 in which a previously processed wafer is unloaded from the plasma chamber rather than being entered into by way of path 301.

The goal determining step 305 may also be otherwise executed at the same time that wafer-unload step 302 executes (in chronological parallelism).

The flow of algorithm 300 continues from step 305 through node 310 to a first test step 315.

In the first test step 315, a determination is made as to whether the current and respective temperature level of each of one or more respective kit parts is above its correspondingly predefined goal temperature range. (This first test 315 and below test 325 can be each alternatively stated in terms of long term equilibrium power levels, 'LTEP's' rather than in terms of temperature as will be explained when FIG. 4B is detailed.)

The first test step 315 may be carried out in open-loop manner as detailed by the below description for FIG. 4B.

Alternatively, the first test step 315 may be carried out in closed-loop manner by actually measuring the temperature of one or more of the kit parts in real-time (and by inferring therefrom the temperatures of any unmeasured kit parts). In the alternate closed-loop approach, appropriate temperature sensors such as optical pyrometers (not shown) may be appropriately provided and operatively coupled to each respective HDP chamber 105 and its corresponding reaction chamber control computer 120 for reporting current temperatures of respective kit parts to the computer 120.

If the closed loop approach is used, a proportional integral differential (PID) feedback system may be employed in place of steps 315–318 and 325–328 for attaining a desired temperature level for a given kit part.

Continuing in algorithm 300, if the answer to first test step 315 is NO (meaning that the current kit part temperature is not above the goal temperature range), then the algorithm 300 continues along path 320 to a second test step 325.

If the answer for first test step 315 is YES (meaning that the current kit part temperature is above the goal temperature range), then the algorithm continues along path 316 to cool-down step 317. In step 317, if the plasma was previously turned on, the plasma is turned off. Then a predefined time period is taken with the plasma kept turned off to allow the kit parts to cool down by way of blackbody radiation.

If faster cool-down is desired, a gas such as argon or nitrogen may be temporarily flowed into the chamber at an accelerated rate (or with reduced vacuum being created by gas exhaust means 161) so as to create a chamber pressure substantially greater than 10 mTorr (e.g., 100 mTorr or higher) and to provide a conduction and/or convection medium by which heat may be removed from the kit parts at a rate faster than that of mere blackbody radiation.

After step 317, the algorithm continues by way of path 318 back to common node 310. If the predefined plasma-off time of step 317 was insufficient to cool the respective kit part or parts down to their respective goal temperature or temperatures, the first test step 315 will again transfer control to cool-down step 317.

At the second test step 325, a determination is made as to whether the current temperature level of each respective kit part is below its corresponding goal temperature range. If the answer to second test step 325 is NO (meaning that each current level is not below its desired goal range), the algorithm continues along path 330 to third test step 335.

If the answer to second test step 325 is instead YES (meaning that the current temperature levels of the respective kit parts are below their respective predefined goal ranges), then the algorithm proceeds along path 326 to temperature-increasing step 327.

As with step 315, the second test step 325 may be carried out in open-loop manner in accordance with FIG. 4B or in closed-loop manner by actually measuring the temperatures of one or more representative kit parts.

At step 327, an ignitable and more preferably a mostly nonreactive gas such as argon (with an optional minor amount of oxygen mixed in) is introduced into the plasma chamber and the plasma is turned on if it was previously off. The power level of the plasma is adjusted to sufficiently heat the kit parts (preferably for a limited time period) so as to raise their temperatures.

The limited time period for the temperature-raising operation of step 327 may be fixed or calculated each time as a function of temperature error (desired goal temperature minus current temperature). Next, the algorithm continues along path 328 back to common node 310.

When the goal temperature range is attained, the algorithm 300 proceeds down flow path 330 to third test step 335.

The third test step 335 determines whether a next wafer is ready for loading into the plasma chamber 105 and for being plasma-processed within the chamber 105. Note that, during the time frame that the third test step 335 is entered into, the kit parts of the plasma chamber 105 are each within their respective goal temperature ranges.

If the answer is no (N) at third test step 335, algorithm 300 proceeds to temperature-maintaining step 337.

In step 337 or beforehand, a determination is made as to what plasma power level is needed to maintain the attained goal temperature ranges of the respective floating kit parts indefinitely.

Note that for each temperature of a given floating kit part, there is a corresponding plasma power level at which heat gain from the plasma is at equilibrium with heat loss and temperature therefore remains constant.

In the example of FIG. 4B, the prolonged maintenance of a plasma power level of 2200 Watts produces an equilibrium temperature level designated as 442 for the given kit part. In the same example of FIG. 4B, long term maintenance of a plasma power level of 2400 Watts produces another constant equilibrium temperature level, above that of level 442. Long term maintenance of a plasma power level of 2000 Watts produces yet another constant equilibrium temperature level, below that of level 442. Long term maintenance of the plasma chamber without plasma (a plasma power level of 0 Watts) results in another constant equilibrium temperature level, the ambient temperature level 440.

The kit part temperature that results from long term maintenance of a given plasma power level is termed here as the 'long term equilibrium temperature' (LTET) of the given plasma power level.

The long term maintained plasma power level that produces a given long term equilibrium temperature for a respective kit part is termed here as the 'long term equilibrium power level' (LTEP) for the given temperature.

At temperature-maintaining step 337 (FIG. 3), a warm-up plasma is turned on if there was no plasma yet ignited and the power level of the warm-up plasma is adjusted to the determined level (to the long term equilibrium power level or LTEP) that will indefinitely maintain the attained or next-desired goal temperature range for the kit parts under consideration.

Note that, if in place of step 337, no plasma was turned/kept on, or the power level of the then-on plasma was less than that necessary for indefinite maintenance of the attained/desired goal temperature range (less than the LTEP), the temperatures of the affected floating kit parts would drop because heat loss would exceed heat gain.

This is what happens for example in FIG. 2 between plot points 262 and 203. The plasma is off and the kit part experiences a net loss of heat, resulting in a drop of temperature.

Note that, if at step 337, a plasma was turned-on or kept-on, but the power level of the then-on plasma was greater than that necessary for indefinite maintenance of the attained goal temperature range (greater than the LTEP), the temperatures of the affected floating kit parts would rise because heat gain would exceed heat loss.

This is what happens for example in FIG. 2 between plot points 202 and 262 of plot 251. The applied plasma power level is greater than the long term equilibrium power level (LTEP) of the kit part 151 for the current temperature, and as a result the temperature of the kit part 151 rises.

On the other hand, if a temperature-maintaining level of plasma power is applied (the LTEP of the current kit part temperature is applied), the temperature of the respective one or more floating kit parts will neither rise substantially nor fall substantially. It will remain at least approximately constant.

This is what essentially happened in region 554 of the test results of FIG. 5A as will be detailed below. A temperature-maintaining level of plasma power was applied during a simulated load delay and the plotted temperatures of three floating kit parts then under consideration were respectively maintained roughly within the band of oscillatory temperatures attributed to them for steady state plasma-processing.

As an alternative to temperature-maintaining step 337 (FIG. 3), it is within the contemplation of the invention to alternatively return from third test step 335 to common node 310 instead of going to temperature-maintaining step 337 in the case where the answer to test 335 is no (N).

Such an alternate return from step 335 to node 310 is less preferred, however, because the temperatures in the plasma chamber would continue to increase if the temperature-increasing plasma power level of step 327 is left in the turned-on state. Eventually, the temperatures of the floating kit parts would rise above their respective goal temperature ranges. The first test step 315 would then direct the algorithm flow into cool-down step 317.

The warm-up plasma would be turned off. Thereafter, the temperatures in the plasma chamber would drop because there is no temperature-maintaining warm-up plasma such as that of step 337 to counter blackbody radiation. Eventually, the temperatures of the floating kit parts would drop below their respective goal temperature ranges and the second test step 325 would direct the algorithm flow into temperature-increasing step 327. The warm-up plasma would be turned back on to its temperature-increasing level of power and kit part temperatures would again rise.

This oscillation of chamber temperatures above and below the limits of the goal temperature range would continue until a point in time where the temperature is in range and the third test step 335 indicates the next wafer is ready for loading into the plasma chamber.

Such oscillation of temperature is undesirable because it thermally stresses the plasma chamber and its components. It is better to maintain a relatively constant temperature within the plasma chamber until the next wafer is ready by using the temperature-maintaining step 337.

The warm-up plasma that is used in steps 327 and 337 may be composed of a wide variety of materials.

According to one further aspect of the invention, the warm-up plasma should preferably not contain substantial amounts of carbonaceous components that may condense on the kit part surfaces during either of stages 327 and 337.

According to a second further aspect of the invention, the warm-up plasma should include substantial amounts of one or more gases such as argon (or another group VIII inert element), nitrogen and oxygen. The relatively inert gases such as argon or nitrogen preferably constitute a major portion by mass flowrate of the warm-up plasma.

In one embodiment, a mixture of approximately 75% argon and approximately 25% oxygen by mass flowrate is used. The minor oxygen component is believed to advantageously oxidize and volatilize any carbonaceous condensate that may be left over on the kit part surfaces from prior plasma etching cycles. The relatively inert argon component of the warm-up plasma does not consume substantial quantities of material from the consumable kit parts during the carrying out of temperature-increasing step 327 or during the carrying out of temperature-maintaining step 337. Thus, kit replacement schedules are not markedly altered by steps 327 and 337. (Kit part consumption rates may increase somewhat, however, from the fact that the initial wafers such as wfr#1–wfr#4 of each run are processed at the higher temperatures of steady state plasma-processing rather than at the residual warmth temperatures.)

The plasma parameters (e.g., power levels, on time, employed gases, etc.) that are used in temperature-increasing step 327 may be kept the same irrespective of whether stage 327 was reached by way of entry path 301 or by way of a later-described loop path 360.

Alternatively, a relatively higher power level may be employed for the temperature-increasing step 327 if that step 327 was reached for a first time by way of the 'initial' entry path 301 and a relatively-lower but still temperature-increasing power level may be employed if step 327 was instead entered by way of loop-around path 360.

Such a two-level approach to the carrying out of temperature-increasing step 327 may be used so as to have a very fast ramp-up of temperature when trying to reach the goal temperature range from a relatively cool initial temperature (e.g., one below the carbonaceous condensation temperature of approximately 180° C.) and so as to have a less rapid, but more precise ramp-up of temperature when trying to reach the goal temperature range from a relatively warmer initial temperature (e.g., one above approximately 180° C.). The very fast temperature ramp-up may be desirable following a relatively long idle time of the chamber wherein the plasma is not turned on. The slower temperature ramp-up may be desirable following a relatively short idle time of the chamber wherein residual warmth has kept the kit part temperatures above the carbonaceous condensation temperature and there is more advantage to attaining a more precise, tighter goal temperature range than there is to quickly getting into a less precise, broader goal temperature range.

When the answer to third test step 335 is yes (Y), the algorithm proceeds along path 340 to steps 345–355.

At step 345, a turn-off command is sent to the source RF generator 165 to make sure that the generator 165 is turned off in case it had been previously left turned on. If the next-executed recipe includes a so-called pre-process subportion, that pre-process subportion (see 401 of FIG. 4A) is preferably carried out in the chamber prior to executing the plasma turn-off portion of step 345.

At step 350 the then-ready wafer is loaded into the plasma chamber 105.

At step 355, the wafer-in-chamber portion of the processing recipe is executed. (See subportions 403-404-405 of FIG. 4A.)

The algorithm flow then continues along a loop-back path 360 to step 302 where the plasma processed wafer is next unloaded at step 302 and entry is made simultaneously or subsequently into goal determining step 305. (A so-called post-process subportion of the recipe may be optionally carried out in the plasma chamber after the wafer-unloading step 302. See subportion 407 of FIG. 4A.)

It is to be understood that algorithm 300 is merely illustrative of numerous other algorithms that may be carried out for shifting the temperatures of respective floating kit parts to respectively defined goal temperature ranges (e.g., 220–240 of FIG. 2) and for maintaining the kit parts each in its respective goal temperature range prior to or between successive executions of a predefined plasma-processing recipe.

By way of example, the goal-determining step 305 does not have to be inserted within the loop of path 360 but may rather be carried out one time outside the algorithmic loop if the same plasma-processing recipe is to be used over and over again for each successive wafer. The temporal positions of the selective kit part cool-down stages 315–317 and kit part temperature-increasing stages 325–327 may be swapped within the algorithm.

A variety of power levels may be used for carrying out the temperature-increasing process of step 327 and the temperature-maintaining process of step 337.

For example, rather than having one power level in step 337, one may employ a set of power levels whose over-time average is equal to the long term equilibrium power level (LTEP) of the goal temperature range. The allowed durations for each of the different power levels used in such an alternate set will depend on the temperature ramp-up and cool-down time constants of the floating kit parts.

By way of further example, rather than using fixed power levels for carrying out either the temperature-increasing step 327 or the temperature-maintaining step 337, the power levels within these steps 327 and/or 337 may be variably adjusted in real-time response to a determined temperature error. The determination of temperature error may be carried out in open loop or closed loop manner. If a closed loop feedback system is used, the power level setting of the warm-up plasma and/or the duration of maintenance of each such power level of the warm-up plasma may be established according to a proportional integral differential (PID) feedback algorithm. The exact amount of time needed for cool down step 317 may be similarly established in open loop or closed loop manner.

If an open loop approach is used, the durations of cool-down step 317 and/or of the temperature-increasing step 327 may be calculated using an algorithm such as set forth below in the description of FIG. 4B. The open loop approach may be used where it is not possible or it is not convenient to actually measure the temperatures of one or more floating kit parts.

Referring now to FIG. 4A, there is shown a sample plasma-processing recipe 400 that is to be executed within a given plasma chamber 105 when plasma-processing a corresponding one or more wafers 115 occurs.

The exemplary recipe 400 has subportions 401 through 407. Subportions 401, 403, 405 and 407 are generally optional but are included for the sake of completeness. Subportion 404 is mandatory and constitutes the primary in-chamber plasma-processing of the wafer or other workpiece.

The first subportion 401 of recipe 400 is a so-called pre-process step that may be carried out before a wafer is loaded into the plasma chamber 105. A typical example of a pre-process step 401 is the step of flowing oxygen into the chamber 105 and igniting an oxygen-containing plasma for the purpose of burning off any organic or other contaminants that may have remained within the plasma chamber from previous usage. In the illustrated example, the preprocess subportion 401 is carried out at a source power level of 2400 Watts for a predefined first time period 451.

Next, the pre-process plasma is turned off, the plasma chamber 105 is optionally purged with an inert gas, and a wafer is loaded into the plasma chamber at recipe subportion 402. The plasma power level for subportion 402 is equal to zero and this no-power phase is maintained for a predefined second time period 452.

At third subportion 403, an easily ignitable gas such as argon is flowed into the chamber and the plasma is ignited (or 'struck') at a recipe-defined power level. In the illustrated example this power level is again 2400 Watts. The strike phase 403 is maintained for a recipe-defined third time period 453.

In the fourth subportion 404 of recipe 400, a chemically reactive gas such as carbon tetrafluoride ($CF_4$) is flowed into the plasma chamber and etching or other plasma-processing of the wafer begins. Typically, the source power level is raised above the strike level 403 in order to carry out etching or other plasma-processing at near-maximum capacity. In the illustrated example, the fourth recipe subportion 404 is carried out for the illustrated fourth time period 454 at a source power level of 2800 Watts.

In the fifth recipe subportion 405, an optional post-etch treatment (PET) may be carried out for a recipe-defined length of time period 455 at a recipe-defined power level. One example of a post-etch treatment is the step of mixing oxygen into the already-ignited and still on plasma for the purpose of stripping away an on-wafer polymer mask layer.

In the sixth recipe subportion 406, the plasma is turned off (0 Watts) for a sixth recipe-defined time period 456 during which the plasma-processed wafer is unloaded.

An optional post-process subportion 407 of recipe 400 may include the flowing in of a chamber cleaning gas into the chamber (such as oxygen) and reigniting the plasma for a given length of time 457 at a recipe-defined level so as to clean away any organic materials that may have deposited on the plasma chamber interior surfaces during the most recent etching or other plasma-processing of the just unloaded wafer. In the illustrated example, the post-process subportion 407 is carried out at a source power level of 2400 Watts.

Generally, only one or the other of the pre- and post-process subportions, 401 and 407, is carried out in a given recipe. Many recipes do not include either of subportions 401 and 407.

Associated with continuous, uninterrupted repetition of recipe 400 there is an average source power level 410 which may be calculated as the area under the plasma-on curve divided by the total time of the recipe (total energy divided by total time).

Given this average source power level 410—and given a presumption that the total time of the recipe (the sum of time periods 451 through 457) is not substantially greater than temperature ramp-up and cool-down time constants of the floating kit parts in question—each floating kit part can be assumed to have a corresponding, long term equilibrium temperature (LTET) that is similarly approached and indefinitely maintained either by continuous maintenance of the given average source power level 410 or by continuous, uninterrupted repetition of recipe 400 (where the recipe 400 is comprised of subportion 404 and optionally of one or more further subportions 401–403, 405–407, with the end of the last subportion of each recipe execution merging into the start of the first subportion of the next recipe execution).

Stated in other words, from the view point of each floating kit part it does not make much difference as far as kit part temperature is concerned whether the same recipe 400 is executed repetitively in continuous, uninterrupted fashion or whether, in place of one or more of the continuous executions of the same recipe 400, a constant plasma having the average source power level 410 is turned on.

Note that the same recipe average source power level 410 is common to all the floating kit parts 151–153 even though the energy contribution from the plasma to each specifically located kit part may be different.

In view of the above, it should now be apparent that if immediately prior to the plasma-processing of a first wafer (wfr#1) in a batch of wafers (immediately prior to time 0 of FIG. 4A), a warm-up plasma had been turned on and had been kept continuously running for a sufficiently long time at the same power level as the recipe average source power level 410 so that the corresponding LTET (long term equilibrium temperature) of each floating kit part is reached and maintained; when the first wafer (wfr#1) is thereafter processed in accordance with the recipe 400, the temperatures of the floating kit parts will be essentially the same as they would have been following a hypothetical previous carrying out of continuous, uninterrupted repetition of recipe 400.

In other words, the floating kit part temperatures will already be at or approximately near their respective steady state levels even though it is only the first wafer (wfr#1) in the batch that is now being processed.

Accordingly, it is one aspect of the invention to ignite and/or maintain a warm-up plasma within the plasma chamber while not executing a predefined plasma-processing processing recipe 400 where the power level (constant or average) of the maintained warm-up plasma is set to at least approximately maintain a goal temperature indefinitely where that maintained goal temperature is the same as the long term equilibrium temperature (LTET) of the recipe average source power level 410. In one embodiment of this aspect, the power level of the temperature-maintaining step 337 of FIG. 3 is set equal to the recipe average source power level 410 of either the most recently executed recipe or of the next to-be executed recipe.

If one is starting at an initial kit part temperature that is well below the goal temperature range, the time required for reaching goal by a warm-up plasma operating at the LTEP of the goal's lower bound may be undesirably long. It is therefore another aspect of the invention to use a warm-up plasma operating at a power level that is substantially greater than the LTEP of the goal's lower bound in order to more quickly reach the goal temperature range. In one embodiment of this aspect, the power level of the temperature-increasing step 327 of FIG. 3 is set to be at least approximately 20% greater than the recipe average source power level 410 of either the most recently executed recipe or of the next to-be executed recipe. (By way of example, in next described FIG. 4B, the power level of the temperature-increasing warm-up plasma is set to 2800 W which is roughly 27% higher than the power level of the temperature-maintaining warm-up plasma, where the latter is set to 2200 W.)

Referring to FIG. 4B, it will now be explained how the temperature-increasing step 327 and the temperature-maintaining step 337 of algorithm 300 may be each carried out in open-loop fashion without actually measuring the temperatures of kit parts in real time.

In FIG. 4B, a first vertical axis 411 is provided on the left for representing successive levels of kit part temperature for a given kit part. A second vertical axis 412 is provided on the right for representing the LTEP's (long term equilibrium power levels) associated with the respective kit part temperatures of first vertical axis 411.

The horizontal axis 413 of FIG. 4B represents time. The break after the 30 minute mark on horizontal axis 413 indicates that the right end of axis 413 may represent a time point much later than the 30 minute mark.

Reference is now made to an increasing-temperature versus time curve 420 of FIG. 4B. When a given kit part having an initial temperature, say an ambient temperature level 440 of roughly 0° C. to 20° C., is exposed to a warm-up or other plasma having an average source power, of say 2800 Watts, the temperature of the kit part increases in a generally exponential manner over time towards the long term equilibrium temperature (LTET) of that source power level (e.g. 2800 W). The specific rate of temperature increase is determined by a respective time constant associated with each plasma power level, each kit part and ambient conditions such as chamber pressure and ambient temperature.

The increasing-temperature versus time curve such as 420 for a given floating kit part and a given level of temperature-increasing power may be pre-established by test measurements carried out over time for different levels of applied source power and for each respective kit part at constant ambient conditions. Alternatively or supplementally, increasing-temperature versus time curves such as the illustrated curve 420 may be approximated mathematically using pre-established simulation and/or interpolation algorithms.

To raise the temperature of a given kit part from a known first temperature level, say ambient level 440 (approximately 0°–20° C.), to a desired second temperature level (goal level), say 442, one may apply a plasma having the corresponding power level of 2800 Watts (constant or effective average) for time period $T_1$ as derived from the increasing-temperature versus time curve 420 associated with that level of source power (2800 Watts) and that kit part.

The exemplary temperature-increasing curve 420, if continued as indicated by dashed portion 421 will exponentially approach the 2800 W level on the right vertical axis 412. The left vertical axis 411 will have a corresponding LTET (long term equilibrium temperature) representing the exponential temperature-increasing limit of the 2800 W plasma.

Temperature level 442 happens to be the LTET of an effective average source power of 2200 Watts in this example. Thus, if one wished to ramp-up quickly to the steady state average temperature level of a recipe having an average source power of 2200 Watts, one can apply a warm-up plasma having an effective average source power of 2800 Watts for time interval $T_1$ to thereby rapidly ramp the temperature of the corresponding kit part up from level 440 to level 442. (Temperature level 442 crosses with corresponding point 422 on the increasing-temperature curve 420.) The term 'effective average source power' is used herein for defining the net energy modifying effects of either a plasma operating at constant power at that stated level or of a plasma whose power magnitude oscillates at a sufficiently high frequency relative to the temperature ramp-up and cool-down time constants of the floating kit parts such that the average source power of the oscillating plasma has substantially the same heating effect on the floating kit parts as does the constant power plasma.

Immediately after point 422 of curve 420 is reached, the corresponding etch or other plasma-processing recipe (e.g., 400) that corresponds to temperature level 442 may be carried out repetitively in steady state at the effective average source power of 2200 Watts without resorting to the use of sacrificial or dummy wafers.

Note that time measurement rather than actual temperature measurement has been used here to determine that point 422 of curve 420 has been reached.

Figure 5A:
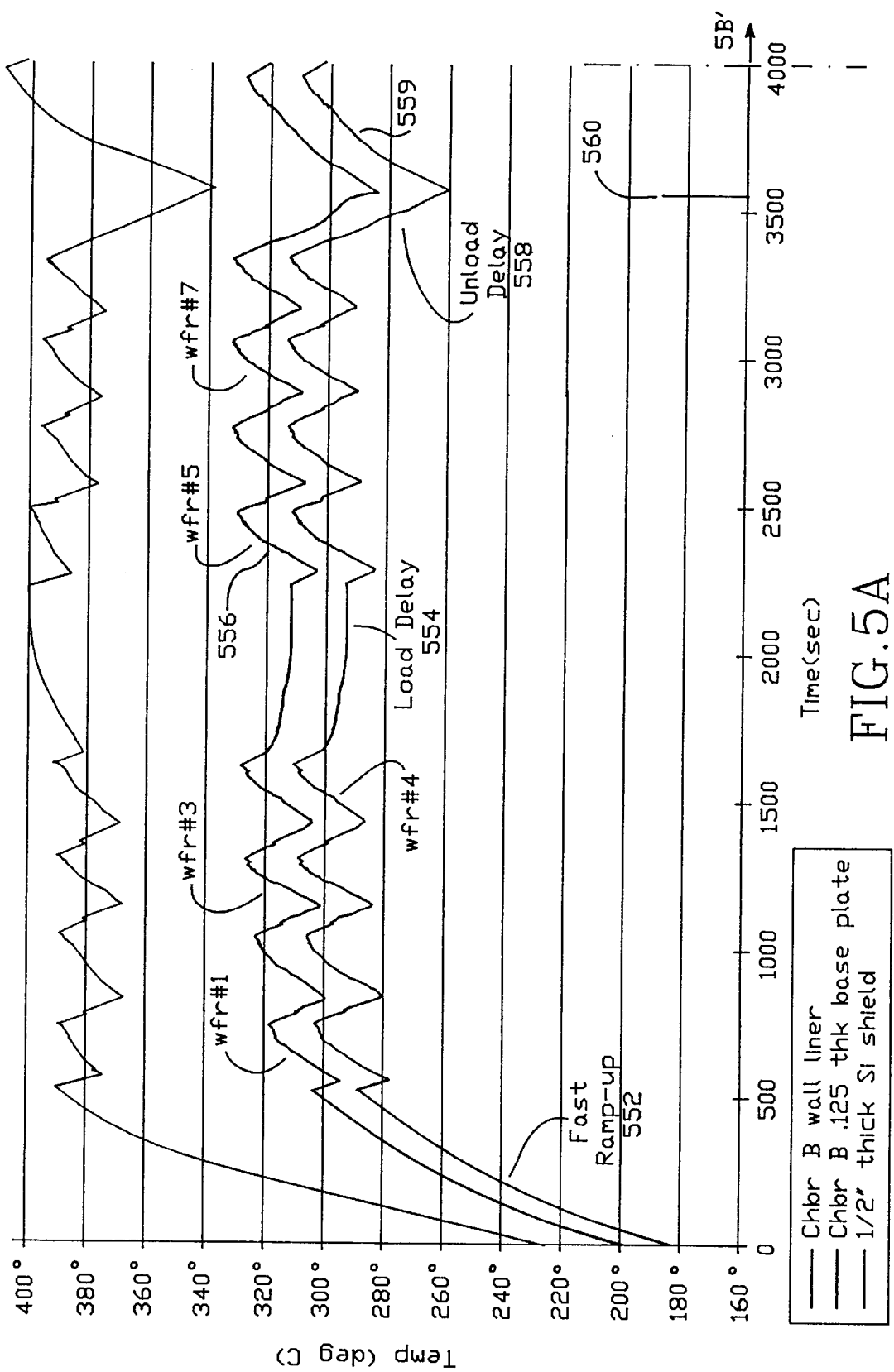
FIGS. 5A and 5B combine to show temperature versus time plots that illustrate how ramp-up to and maintenance of steady state conditions are achieved for multiple kit parts in accordance with the present invention.

An example of a measured fast ramp-up to predetermined steady state temperature conditions is illustrated at region 552 of FIG. 5A.

Still referring to FIG. 4B suppose that when point 422 of curve 420 is reached, the next wafer to be plasma-processed by a corresponding etch or other plasma-processing recipe (e.g., 400) is not yet ready. This corresponds to a no result (N) at third test step 335 of FIG. 3. In such a case, rather than immediately switching into a mode of continuous repetition of the intended recipe 400, the effective average power level of the warm-up plasma is instead switched from the temperature-increasing level of curve 420 to a temperature-maintaining power level of flat line 450 (to the recipe average power level, which in this example is 2200 W). The long term equilibrium temperature (LTET) of power level 450 is the goal temperature level 442. This switchover to the temperature-maintaining power level corresponds to step 337 of FIG. 3.

Thereafter, somewhere along line 450 after point 422, when the next wafer to be plasma-processed is finally ready, another switchover is made into continuous repetition of the intended recipe 400. Such a switchover corresponds to path 340 of FIG. 3.

Note again that actual temperature measurements have not been used here to determine that chamber conditions are proceeding effectively along the temperature-maintaining flat line 450. Instead, once point 422 of curve 420 was reached, an immediate switchover was made to a mode where the effective average plasma power level in one form or another (constant or oscillatory) was continuously kept at approximately 2200 W. This assures that chamber conditions are riding along line 450 irrespective of elapsed time.

Still referring to FIG. 4B, suppose that after riding along flat line 450 for some time, and after having repetitively executed recipe 400 during that intervening time or having otherwise maintained a temperature-maintaining warm-up plasma during that intervening time, the plasma chamber has to be switched into an idle mode wherein the plasma is to be kept turned off for an undefined amount of time. This idle time begins for example at arbitrarily selected point 432 of curve 430.

One reason that a switchover to the idle state may have occurred at point 432 is that all the wafers of a given first lot have been successfully processed at steady state conditions, and the cassette 101 of the first lot is being removed from system 100 and no next cassette is yet loaded in for processing. The plasma chamber 105 may sit idle for an arbitrary time period, $T_2$ until a next wafer is made available and brought into position for plasma-processing within the plasma chamber 105.

Because there is no plasma energy being supplied to the kit parts during the idle time period $T_2$, heat loss due to blackbody radiation predominates and the temperature of each floating kit part drops along a corresponding 0-Watt cool-down curve 430 (the decreasing-temperature versus time curve 430) from point 432 to point 433. Point 433 corresponds to a new temperature level 441 that is below the LTET level 442 of the recipe average power level (2200 W in this example).

Like the increasing-temperature versus time curve 420, the cool-down curve 430 defines how the temperature of a corresponding kit part decreases in a generally exponential manner over time towards the long term equilibrium temperature (LTET) of the then present source power level. In this case the effective source power level is 0 W and its LTET is the ambient temperature level 440. The specific rate of temperature decrease is determined by the respective time constant associated with the kit part under consideration and ambient conditions. Chamber pressure may be increased if desired to quicken the cool-down process by way of additional means such as convection and/or conduction between the denser chamber atmosphere and the floating kit parts.

The decreasing-temperature versus time curve such as 430 for each given floating kit part may be pre-established by test measurements carried out over time for different initial temperatures or corresponding levels of long-applied source power at constant ambient conditions. Alternatively or supplementally, decreasing-temperature versus time curves such as the illustrated curve 430 may be approximated mathematically using pre-established simulation and/or interpolation algorithms.

Note that because each temperature point on the left vertical axis 411 has a corresponding LTEP point on the right vertical axis 412, each of curves 420 and 430 can be defined in terms of LTEP versus time instead of temperature versus time.

Assume that at the time when point 433 of the idle phase is reached, the next wafer is ready for plasma-processing within the plasma chamber 105. Assume further that the next wafer is to be plasma-processed according to a next recipe also having an effective average source power of 2200 Watts.

In such a case, a switchover can be made from point 433 on the cool-down curve 430 to a new point 423 on the increasing-temperature curve 420, where the new point 423 lies on a horizontal line 460 that extends to temperature level 441 on the left vertical axis 411 and to its corresponding LTEP on the right vertical axis 412.

In the switchover from point 433 to point 423, a temperature-increasing warm-up plasma having an effective average power of 2800 W is ignited and maintained for time interval $T_3$. Time interval $T_3$ is determined by moving along curve 420 from point 423 to point 422. This move can be defined by its projection either onto the left vertical axis 411 or by its projection onto the right vertical axis 412. If the projection onto the right vertical axis 412 is used, there is no need to measure or speak in terms of temperature change. The move may be defined solely in terms of change in LTEP. Curves 420 and 430 may be correspondingly presented solely in terms of LTEP versus time. The time interval $T_3$ needed to move along curve 420 from point 423 to point 422 may be defined as that time needed to move from the corresponding LTEP of point 423 to the corresponding LTEP (2200 W) of point 422.

With the 2800 W warm-up plasma now turned on for time interval $T_3$, the temperature of the subject kit part moves from the idle-induced temperature level 441 back to the desired goal level 442. In one embodiment, the warm-up plasma is composed of a relatively inert mixture such as 75%, argon mixed with 25% oxygen as measured by average mass flowrate over time interval $T_3$.

By keeping track of elapsed time during the application of temperature-increasing plasmas and by keeping track of elapsed idle time when there is no plasma (and if applicable, also keeping track of elapsed time during the application of temperature-decreasing plasmas), one may follow respective up and down transitions along increasing-temperature curves such as 420 and cool-down curves such as 430. The current states of floating kit parts at each point in time may be defined in terms of temperature if projected onto the left vertical axis 411 or in terms of LTEP if projected onto the right vertical axis 412.

This open loop tracking of the current states of floating kit parts at each point in time may be used in conjunction with the pre-established increasing-temperature and decreasing-temperature curves (e.g., 420 and 430) to determine what interval of next application of a temperature-increasing plasma or what interval of next maintenance of the idle state is needed to move the floating kit parts under consideration from their present states to desired, next goal states (e.g., from point 433 to point 422).

Although the above example assumed that a next-to-be attained goal state has a temperature level (e.g., 442) above that (e.g., 441) of the just completing idle interval $T_3$, it is also within the contemplation of the invention to have a next-to-be attained goal state that has a LTEP below that of a just completing idle interval. In such a case, the lower, next-to-be attained goal state may be reached simply by riding down a cool-down curve such as 430 for an appropriate interval of time and then turning on a corresponding temperature-maintaining plasma.

The method of tracking kit part states as a function of time and either temperature or LTEP, which method is exemplified by FIG. 4B, may be incorporated into steps 317, 327 and/or 337 of algorithm 300 (FIG. 3) for the purpose of providing machine-implemented automatic ramp-up or ramp-down to a desired goal state and/or for long-term maintenance of such a desired goal state.

Although FIG. 4B contemplates open-loop (or partially open-loop) control systems wherein the actual temperature of the kit parts is not directly and immediately measured, it is also within the contemplation of the invention to use closed-loop feedback systems wherein the temperatures or related other parameters of one or more representative kit parts are measured in real time so as to more accurately determine their temperature versus time responses to the application of plasma energy and as to more accurately determine their temperature versus time heat loss characteristics when the plasma is turned off. The closed-loop feedback systems may also incorporate predictive features wherein a measurement-established version of FIG. 4B for each specific plasma chamber is used to predictively reach a desired goal temperature for a given kit part without immediate feedback. As already indicated, in the closed-loop systems appropriate temperature sensors, such as optical pyrometers (not shown) may be provided optically coupled to the interior of each respective plasma chamber 105 and further coupled to its corresponding reaction chamber control computer 120 for immediately determining current temperatures of respective kit parts within that plasma chamber 105.

Figure 5B:
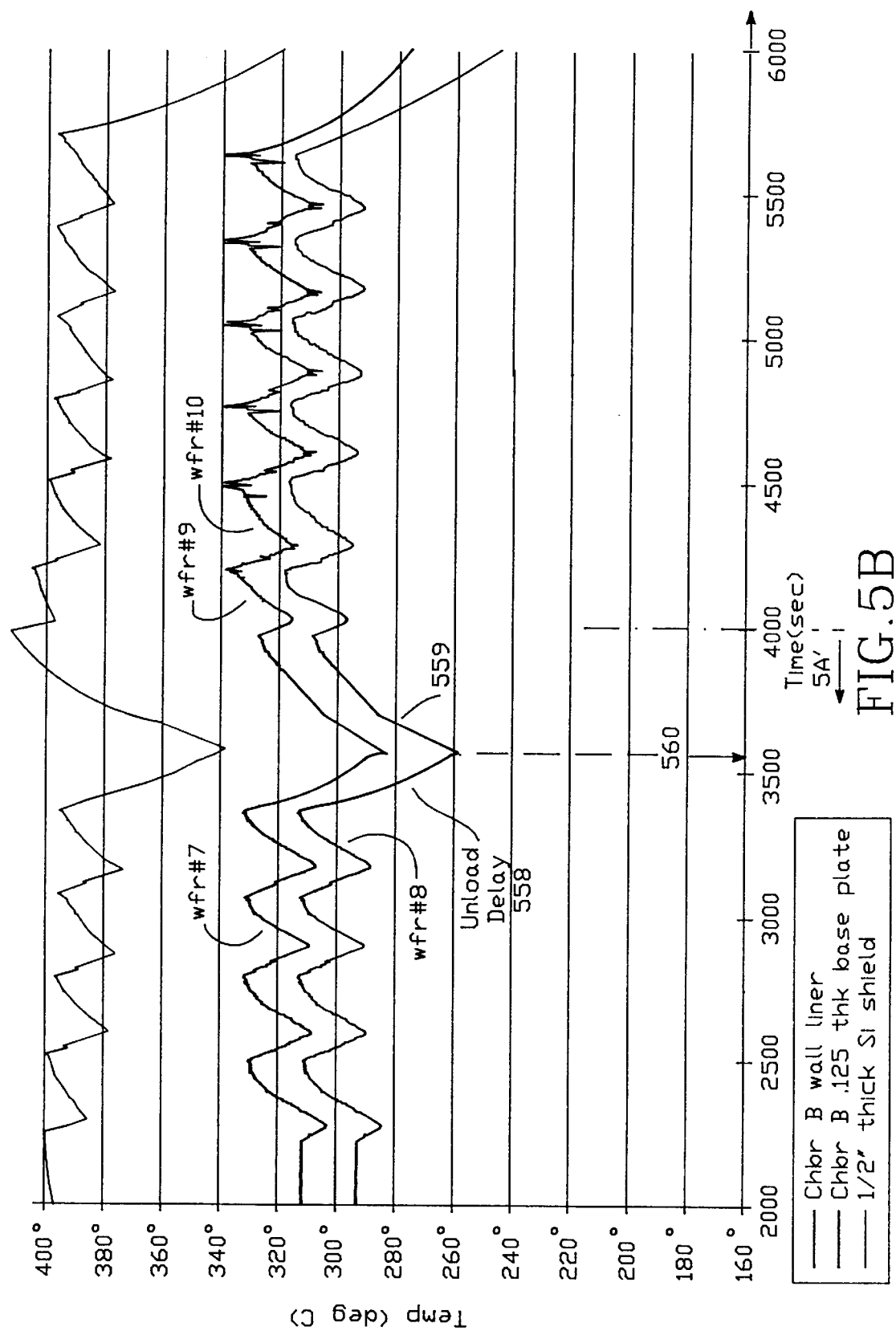

FIGS. 5A and 5B join at the 4000 second time mark to form a long strip of data obtained from experiments carried out using open-loop temperature control of floating kit parts in accordance with a second algorithm 600 which will be further described with reference to FIG. 6.

As seen in FIGS. 5A and 5B, a fast ramp-up operation 552 was employed using a relatively inert warm-up plasma (75% argon plus 25% oxygen) operating at a temperature-increasing power level to bring the kit parts near to the steady state operating conditions of the process recipe. Wafers wfr#1 through wfr#4 were then immediately processed as actual production wafers rather than as dummy or sacrificial wafers.

A load delay problem was simulated at time region 554 to test the system's response to such a load delay interruption. The load delay occured after the plasma chamber had unloaded its previous wafer but before a new wafer was loaded into the same plasma chamber 105.

Figure 6:
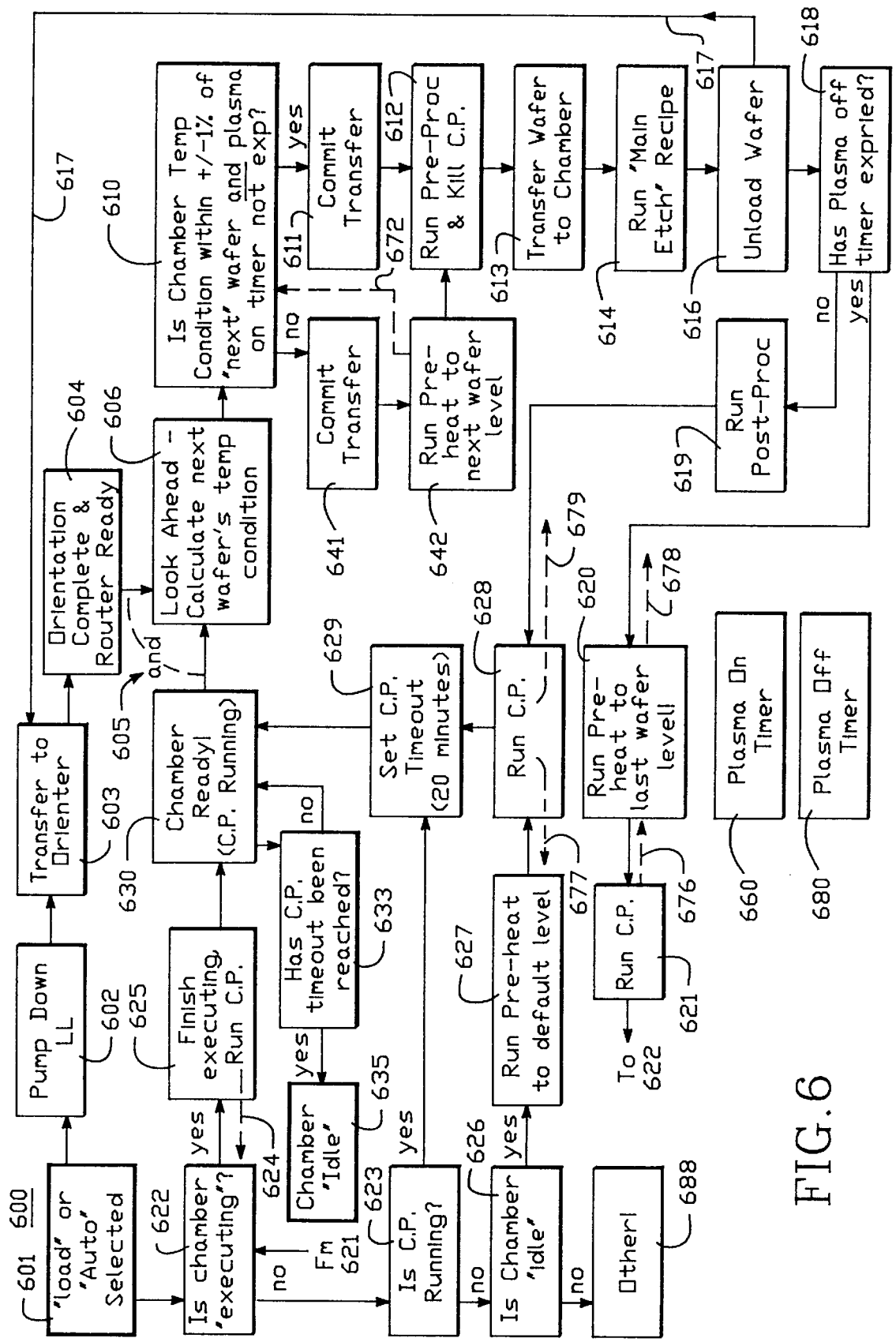
FIG. 6 is a flow chart of a second warm-up algorithm in accordance with the invention.

As seen in FIG. 5A, although the recipe was blocked from being executed during the simulated load delay problem of time region 554, the steady state temperature of the kit parts was automatically maintained by a temperature-maintaining warm-up plasma invoked by algorithm 600 (in step 628 of FIG. 6 to be more specific).

When wafer wfr#5 was finally indicated to be ready for loading into the plasma chamber, the wafer could be immediately loaded and processed at steady state conditions with no or minimal further delay.

Region 558 of FIGS. 5A and 5B represents a simulated unload delay which was introduced after wafer wfr#8 was plasma etched but before it could be unloaded from the chamber. The simulated unload problem put the executing recipe 400 into an unfinished state wherein the plasma is turned off but the post-processing subportion 407 of the recipe has not yet executed. In this case, algorithm 600 starts a plasma-off timer (680, FIG. 6) which tracks the amount of time the chamber spends in the plasma-off state.

When the unload delay problem is rectified at arbitrary time point 560 and the wafer unloads, the elapsed count in the plasma-off timer (680, FIG. 6) is captured and used to determine in open-loop manner how far down its respective cool-down curve 430 each floating kit part has fallen.

Then the post-processing subportion 407 of the notyet complete recipe is executed at its recipe defined power level (see 625 of FIG. 6). This starts the up slope of time region 559. A plasma-on timer (660, FIG. 6) is started to keep track of the amount of time the chamber spends in the plasma-on state of the then completing post-processing subportion 407 (if any). When subportion 407 completes, the elapsed count in the plasma-on timer (660, FIG. 6) is captured and used to determine in open-loop manner how far up its respective increasing-temperature versus time curve 420 each floating kit part has risen. If the next goal state is not yet reached, the plasma is continued as a relatively inert warm-up plasma to bring the temperatures of the floating kit parts into their respective steady state ranges. Then wafer wfr#9 is inloaded and plasma-processed. Wafers wfr#10 and so on follow at the established steady state conditions.

In summary, FIGS. 5A and 5B show that steady state kit part temperatures can be quickly attained by preheating the chamber with a temperature-increasing warm-up plasma composed mostly of argon or of a similar, relatively inert gas. FIGS. 5A and 5B further show that the steady state condition may be automatically maintained (554) or returned to (559) despite random insertions of interruptions into the otherwise continuously repetitive executions of the recipe.

FIG. 6 illustrates a flow chart of the second algorithm 600. Algorithm 600 may be run in accordance with the invention across the plural computers 110, 120, 130 of FIG. 1 or on other appropriate platforms. Algorithm 600 may be used for carrying out cluster-based etching or other plasma-processing of wafers or of other workpieces while continuously keeping floating kit parts at their respective steady state temperatures during each recipe execution. The algorithm 600 relies on two real-time chronometers implemented in hardware or by equivalents (e.g., periodic interrupts to software clocks). These two chronometers have already been introduced above as the plasma-on timer 660 and the plasma-off timer 680.

Algorithm 600 is entered at step 601 in response to an activation of the 'LOAD' button or an activation of the 'AUTO-RUN' button.

From entry step 601, the process continues in chronological parallelism to steps 602 and 622. Step 602 is executed by the router control computer 110 while step 622 is executed by the reaction chamber control computer 120.

In step 602 the cassette load lock is pumped down to prepare for a next wafer transfer. In the following step 603, if the plasma chamber is empty or has been just unloaded, a next wafer 102 is transferred to wafer orienter 113 (FIG. 1) for orientation and subsequent loading into the now empty plasma chamber. At step 604, a determination is made that the orienter 113 has completed its orientation function and the router 103 (FIG. 1) is ready to deliver the pre-oriented wafer 112 to a next-ready plasma chamber 105.

At the same time that steps 602–604 are carried out by the router control computer 110, the chamber control computer 120 of the target chamber should have been executing parallel steps for shifting the temperatures of the floating kit parts of the target chamber to next goal temperature ranges. The next goal temperature ranges should be selected to at minimum keep the respective kit parts above their respective carbonaceous condensation temperatures. The next goal temperature ranges should more preferably be selected to bring the floating kit parts at least relatively close (e.g., within 20%) of their respective steady state temperatures of the next to-be-executed recipe 400.

At step 622, the chamber control computer 120 checks to see if the corresponding plasma chamber is still in the middle of executing an earlier-defined plasma-processing recipe. If the answer is yes, that indicates that the 'AUTO-RUN' button was probably activated to continue a 'STOP'ped run or that entry into step 622 was made from below-described step 621. A still unexecuted subportion of a 'STOP'ped or otherwise interrupted recipe—usually the post-processing subportion 407—still needs to be completed.

In this case (yes at 622), the machine state corresponds to point 560 of FIGS. 5A–5B. The plasma chamber has been idle for some time and the plasma-off timer 680 has been keeping track of the elapsed time. The amount of reheating that is needed to bring the floating kit parts back to their respective goal temperature ranges can be determined (e.g., using the method of FIG. 4B).

If the wafer has already unloaded and the only thing left to do is the post-processing subportion 407, then kit part temperatures will not be critical. The post-processing subportion 407 can be performed without first returning the chamber to the goal temperature range (e.g., to the LTET of recipe average power level).

On the other hand, if the wafer is still in chamber and needs further plasma-processing, it may be advisable to first reheat the floating kit parts to the last-defined goal temperature range using a fully inert warm-up plasma (e.g., essentially all argon), and then to complete execution of the remainder of the recipe. Alternatively, the wafer could be unloaded prior to the re-heat and then re-loaded into the chamber once the goal temperature range has been attained. (In this latter case the re-heat can use an oxygen containing warm-up plasma to clean the kit part surfaces without worry that the wafer will be undesirably transformed.)

The plasma-on timer 660 is initialized and activated each time the chamber plasma is ignited at a defined power level or its power level is changed. This allows the software to keep track of kit part temperatures or kit part LTEP states in accordance with increasing-temperature or cool-down curves such as 420 and 430 of FIG. 4B.

Completion of the still-executing recipe occurs in step 625.

Then, rather than allowing the plasma to shut off (or to remain off if there was no post-processing subportion 407) and thereby allowing the temperatures of the floating kit parts decay, the constitution of the still-on plasma (if it is still on, or otherwise the plasma is first re-ignited) is switched to that of a relatively inert warm-up plasma and its power level is set to a temperature-maintaining level.

This creation of the warm-up plasma also happens inside of step 625 and is referred to as 'Run C.P.'. C.P. stands for 'continuous plasma' and indicates that a warm-up plasma is being maintained to prevent substantial decay of kit part temperatures.

The effective average power of the warm-up plasma is set equal in step 625 to the LTEP of the last-defined goal temperature range. This is indicated by the dashed back-pointing line 624 that links the phrase 'Run C.P.' back to box 622. The LTEP of the last-defined goal is temperature range can be the recipe average power level of the just completed recipe.

Each time 'Run C.P.' is executed, a timeout duration is set for the plasma-on timer 660 to prevent indefinite maintenance of the warm-up plasma. Such a timeout setting is shown in box 629 and is illustrated for purpose of example as defining a 20 minute limit. To avoid illustration crowding, no timeout setting is shown for the 'Run C.P.' of box 625, but such a setting is nonetheless understood to occur.

Once a temperature-maintaining continuous warm-up plasma (C.P.) is established in the plasma chamber, the chamber is deemed 'ready' for conditional step 605 and algorithm 600 proceeds to stage 630 ('Chamber Ready').

While in the 'Chamber Ready' stage 630, algorithm 600 periodically enters a timeout testing step 633 and tests for a time-out event by the plasma-on timer 660. If the timeout event has not occurred, the algorithm loops back to stage 630.

On the other hand, if the timeout event has occurred, rather than looping back to 630, the algorithm shuts off the plasma and exits through step 635. The plasma-off timer 680 is started and the plasma chamber is indicated to be in 'idle' mode.

If there is no timeout, the 630–633 loop is repeated until step 604 flags a router ready, condition to the AND condition tester 605. A logic true indicates that the plasma-on watchdog timer 660 had not yet timed out and the plasma chamber is 'ready', and the router is also 'ready'. In such a case, the algorithm next proceeds to a look-ahead calculating step 606 which is described later below.

Referring again to step 622 (chamber executing?), if the answer is no at this step 622, the algorithm next proceeds to step 623 where it tests the chamber condition to see if a continuous warm-up plasma has been turned on prior to entry into step 622 and whether that C.P. is still running. If the answer is yes, the algorithm proceeds to step 629 wherein the plasma-on watchdog timer 660 is reset (e.g., for another 20 minutes of CP running) and control is passed on to the 630–633 loop.

If the answer is no at test step 623 (CP running?), the process continues to step 626 where it determines whether the chamber is otherwise 'idle'. If the answer is no, the system is deemed to be in an improper state and an exception is taken by way of step 688.

Otherwise, it is understood that the plasma-off timer 680 has been tracking a chamber idle state and that the floating kit parts have been cooling down for some arbitrary length of time. This corresponds to the idle time period $T_2$ of FIG. 4B. An answer of yes at test step 626 therefore corresponds to being at point 433 of FIG. 4B.

The algorithm 600 responsively proceeds to step 627 where a temperature-increasing operation (pre-heat operation) is initiated by igniting a warm-up plasma within the plasma chamber 105 and first setting the power level of the source generator to a fast ramp-up power level. In one embodiment, the fast ramp-up power level is the maximal level used for fast ramp up (e.g., 2800 Watts) of kit part temperature. This operation corresponds to that portion of FIG. 4B where a switchover is made form point 433 to point 423 and a climb is initiated up the temperature-increasing curve 420.

The next goal temperature range defines the time interval $T_3$ (FIG. 4B) to be spent in the temperature-increasing mode. In one embodiment, the next goal temperature for each floating kit part is a default value equal to part's LTET of 2120 Watts. In other words, 2120 W is the LTEP of the goal state. As explained above, one can define a climb up curve 420 in terms of change in LTEP (right vertical axis 412 of FIG. 4B) rather than in terms of change in temperature.

When the goal state is reached (point 422 of FIG. 4B), algorithm 600 switches over to step 628 ('Run C.P.'). The continuous plasma power level set at step 628 is equal to the LTEP of a goal state defined in the step from which 628 was entered into. Thus, in the case where step 628 ('Run C.P.') is entered into from step 627, the warm-up plasma power level is set to the LTEP of the default goal state (to 2120 W for the one embodiment mentioned just above). Dashed line 677 indicates the reference back within step 628 to the preceding step 627 for determining the power level of the temperature-maintaining warm-up plasma.

At next step 629, the plasma-on watchdog timer 660 is reset (e.g., to allow 20 minutes of CP running) and control is passed on to the 630–633 loop.

When the AND condition tester 605 indicates that the chamber is 'ready' (it is in continuous plasma running mode and is maintaining the goal temperature or goal LTEP), and at the same time that the next wafer is ready for loading into the readied plasma chamber 105, algorithm 600 proceeds to step 606.

Note that in a cluster-based version of system 100, any one of plural plasma chambers 105a–105c may be the next one that is 'ready'. It is not until the 'chamber ready' indicator 630 of a given plasma chamber outputs a ready signal that one can begin to predict from the viewpoint of that given plasma chamber what next wafer the chamber will receive. Similarly, from the viewpoint of each next wafer being prepared in router 103, it is not until the 'chamber ready' indicator 630 of a given plasma chamber outputs a ready signal that one can begin to predict which of the plural plasma chambers 105a–105c will be the actual destination 114 of the in-router wafer 112.

In step 606, the goal temperature (e.g., the LTET of recipe average power level 410) or the goal power level (e.g., 410) that is to be attained just prior to the execution of the plasma-processing recipe 400 of the now-ready wafer is determined. In one embodiment, step 606 calculates the recipe average power level 410 for the next to-be executed recipe and uses that calculated value or its LTET as the next goal state.

Note that the goal state to be attained at the start of the next to-be-executed plasma-processing recipe 400 is not necessarily the same as that established in back-referencing step 624, wherein the goal for the last-executed recipe is assumed to be the goal for the next to-be executed recipe. Nor is the next goal state necessarily the same as the default state defined in step 627. Nor is it necessarily the same as some other goal state defined before entry into step 601 and continued by way of the yes path out of step 623 (C.P. already running?).

At step 610, a determination is made as to whether the continuous plasma is still running (because the plasma-on timer 660 has not timed out or 'expired' yet) and as to whether the current conditions of the floating kit parts (in terms of LTEP or temperatures) are within approximately 10%, and more preferably within approximately 3%, and yet more preferably within approximately 1% of the goal state for the next to-be-executed wafer recipe.

If the answer at step 610 is yes, the algorithm proceeds to step 611 wherein the wafer 112 in router 103 is assigned for transfer 114 into the present chamber 105. (In a cluster-based version of system 100, any one of plural plasma chambers 105a–105c may be the next one that is 'ready' for and assigned or 'committed' to receive the in-router wafer 112.)

In step 612, if there is a preprocess subportion 401 in the next wafer recipe 400, the still-running plasma of the chamber 105 is modified in accordance with the recipe to execute the preprocess subportion 401 of the recipe.

Thereafter the plasma turned off. When the plasma is turned off at the end of the preprocess subportion 401 of a now-executing recipe, or alternatively when the plasma is turned off at the end of a pre-recipe temperature-maintaining stage (if there is no preprocess subportion 401 in the now to-be executed recipe), the continuous plasma (CP) state is deemed to be 'killed'. The plasma-off watchdog timer 680 is started at the time the plasma is shut off to keep track of plasma off time.

Note that if the 'STOP' button is hit between steps 612 and 613, and there was no preprocess subportion 401, the recipe 400 would not yet be in the 'executing' phase. If the 'AUTO/RUN' button is thereafter activated, algorithm 600 will fall through the 'no' paths of steps 622 and 623. The answer at test step 626 will be 'yes' because the plasma-off timer 680 will have been started in step 612 when the warm-up plasma was turned off (when CP was 'killed'.)

Alternatively, if the 'STOP' button is hit between steps 612 and 613, and there was a preprocess subportion 401 performed in step 612, the recipe 400 would be in the 'executing' phase. If the 'AUTO/RUN' button is thereafter activated, algorithm 600 will route through the 'yes' path of step 622. By virtue of back-referencing step 624, the power level of the warm-up plasma will be set in step 625 equal to the LTEP of the last-defined goal state, which state is the same as that pending at the end of step 612.

Following step 612, in step 613 the assigned and preoriented wafer 112 is transferred 114 into the empty, optionally preprocessed, plasma chamber 105.

In step 614, the main in-chamber portion (403-404-405) of the current plasma-processing recipe (400) for the in-chamber wafer 115 is executed. The plasma-off timer 680 is stopped and the plasma-on timer 660 is optionally restarted at this time to keep track of the plasma energy applied to the floating kit parts during execution of the main in-chamber portion (403-404-405) of the recipe. If the period of the main in-chamber portion (403-404-405) is so short relative to the heat-up (420) or cool down (430) curves of the affected floating kit parts so as not to make any substantial difference, the step of restarting the plasma-on timer 660 may be skipped.

At step 616 the plasma is turned off and the plasma-off timer 680 is restarted to keep track of plasma-off time. If all goes well, the next-executed wafer unload process should take no more than the allotted time interval 456 (FIG. 4A) of the recipe 400.

Once the plasma-processed wafer is successfully unloaded 116 from the plasma chamber 105 at step 616, a handshake signal 617 is communicated to the router control computer 110 for causing the router 103 to transfer the unloaded wafer back to the orienter 113. When ready, the orienter 113 re-orients the plasma-processed wafer for return 117 to the cassette 101. A next, not-yet plasma-processed wafer is thereafter loaded 111 onto the orienter 113 and prepared for insertion into the next-ready plasma chamber 105.

After the wafer is unloaded in step 616, preparations are made in step 618 to execute in step 619 a post-processing subportion 407, if any, of the current recipe. The plasma-off watchdog timer 680 is tested at step 618 to see if the plasma has been turned off for more than a predefined amount of time. In one embodiment, the predefined amount of time is slightly longer (e.g., 10% more) than the recipe-defined time 456 for unload.

An answer of no at test step 618 indicates that wafer unload has taken place approximately within the recipe-allotted time interval 456 (FIG. 4A). In such a case, algorithm 600 next proceeds to step 619 and a plasma is re-ignited within chamber 105. If the current recipe includes a post-processing subportion 407, the ignited plasma 155 is configured according to the recipe's post-processing subportion 407. Otherwise, algorithm 600 skips forward to step 628 wherein the ignited plasma is modified into a warm-up plasma (e.g., composed primarily of relatively inert components such argon or nitrogen).

When step 628 ('Run C.P.') is entered into from step 619, a back-reference 679 is made to the just executed recipe for determining what goal state should now be maintained by the continuously running warm-up plasma. The algorithm 600 then continues through step 629 as explained above.

If the answer is yes at step 618, that indicates that the wafer unload took more time than expected. The floating kit parts have probably cooled to temperatures below their respective goal temperature ranges (e.g., each is at a temperature below the kit part's LTET for the average power level 410 of the currently executing recipe). Control is transferred to step 620 wherein a chamber temperature-increasing operation (pre-heat operation) is initiated. A temperature-increasing warm-up plasma is ignited and the time interval ($T_3$) for this operation 620 is set as indicated by back-referencing dashed line 678 to return the chamber's floating kit parts back to the goal condition of the currently still-executing or just-finished recipe.

From step 620, the algorithm proceeds to step 621 ('Run C.P.') wherein a temperature-maintaining continuous plasma is optionally established. As indicated by back-referencing dashed line 676, the maintenance goal of step 621 is the same as the ramp-up goal of step 620. If the post-processing subportion 407 of the previous recipe is still to be completed, step 621 can be bypassed and control may move immediately to steps 622 and 625.

From step 621 control passes to step 622. If there is still a post-processing subportion 407 to be completed, that is done in the following step 625. If the previous recipe already completed, control passes to step 623 and the pre-established temperature-maintaining continuous plasma of step 621 is continued as explained above. If a CP was not optionally established by step 621, control passes to step 626 and pre-heat to the default state proceeds as explained above.

Returning to step 610, if the tested chamber condition (in terms of LTEP or kit part temperatures) was outside the acceptable range, control is passed over to step 641. In step 641, as in step 611, the wafer 112 in router 103 is assigned for transfer 114 into the present chamber 105.

In the following step 642, a chamber temperature-increasing operation (pre-heat operation) is initiated. A temperature-increasing warm-up plasma is ignited and the time interval ($T_3$) for this operation 642 is set as indicated by back-referencing dashed line 672 to bring the chamber's floating kit parts to the goal condition range specified in box 610. Thereafter control passes to the already-described step 612.

Figure 7:
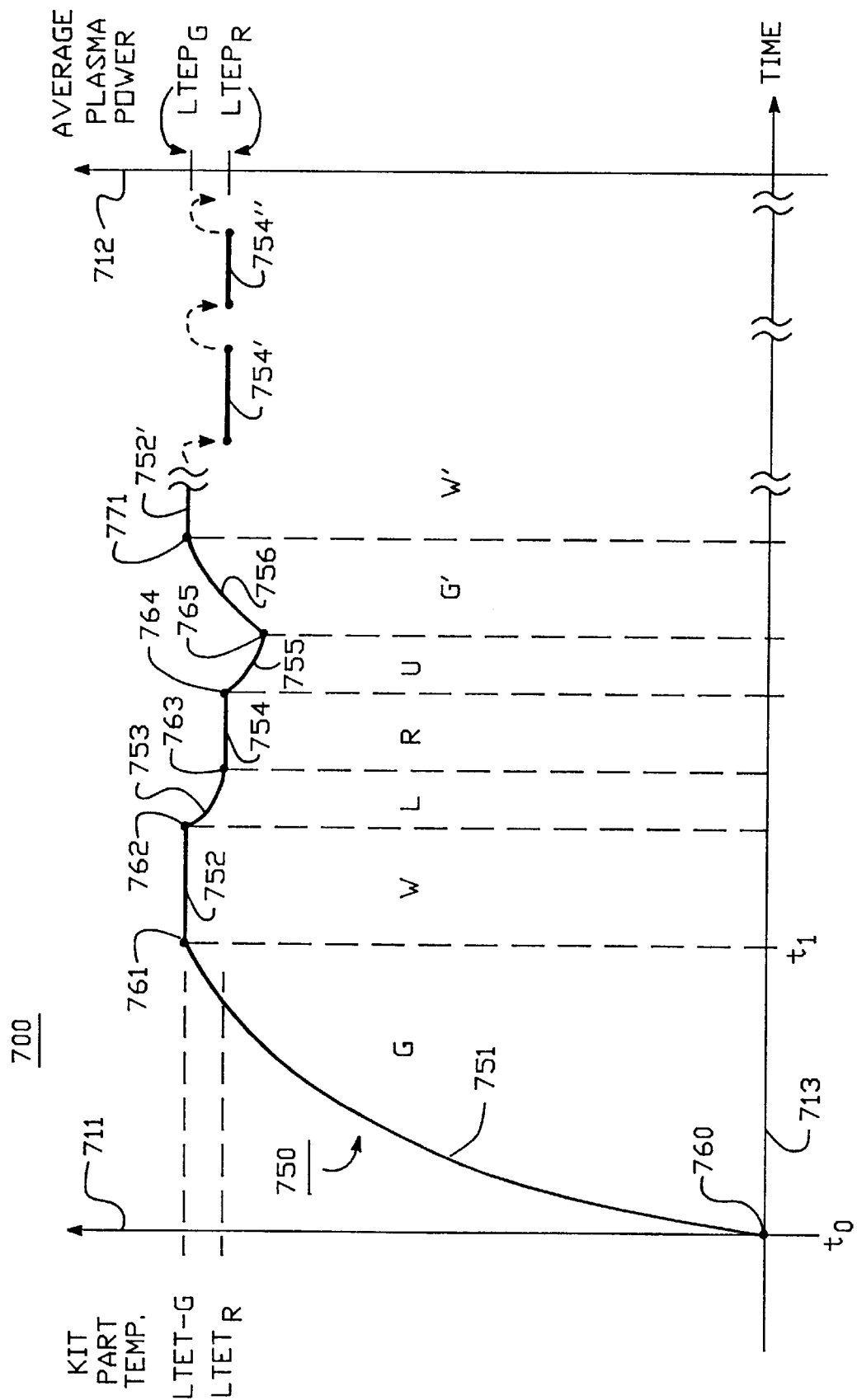
FIG. 7 is a temperature versus time plot showing a how a constant in-recipe temperature method may be carried out for floating kit parts in accordance with the invention.

Referring to FIG. 7, another method 700 in accordance with the invention is illustrated. Rather than setting the goal temperature range to center about the average power level of the next to-be executed recipe, the goal temperature range (or equivalent LTEP) is set to center about a goal state (LTET$_G$ when defined in terms of temperature, or LTEP$_G$ when defined in terms of effective average power) which is slightly above a long term equilibrium temperature of the main subportion such as 404 (see FIG. 4A) of that recipe. The long term equilibrium temperature of the main subportion of the recipe is defined as LTET$_R$ in FIG. 7 and its corresponding long term equilibrium power level is defined as LTEP$_R$ in FIG. 7. In the example of FIG. 4A, the LTEP$_R$ of fourth subportion 404 is 2800 Watts.

Like FIG. 4B, FIG. 7 has a left vertical axis 711 for representing successive levels of kit part temperature for a given kit part. A second vertical axis 712 is provided on the right for representing the LTEP's (long term equilibrium power levels) associated with the respective kit part temperatures of first vertical axis 711. The horizontal axis 713 of FIG. 7 represents time.

In the example of FIG. 7, a simple plasma-processing recipe is assumed having only a main subportion 404 in which plasma etching or another type of substantive plasma-processing of a wafer takes place. There are no optional pre-process or post-process subportions such as 401 and 407 in this example. However, it will become apparent from the below how method 700 can be applied to more complex recipes.

In FIG. 7, plot 750 represents the temperature versus time for a given floating kit part under consideration. Plot 750 includes subportions 751 through 756, 752', 754' and 754". It is to be understood that each of plural floating kit parts can be considered at one time, and that each such kit part will generally have its own unique temperature versus time plot, and that compromises may have to be made to account for differing responses of different floating kit parts to a commonly applied warm-up plasma.

At initial time point to, the kit part is at ambient state 760. A temperature-increasing warm-up plasma is ignited and maintained for a sufficient interval G, as indicated by plot subportion 751, to raise the kit part's temperature from its initial value at point 760 to a predefined goal value indicated by plot point 761. Like the temperature-increasing warm-up plasmas described before, the plasma of plot subportion 751 is preferably composed primarily of relatively inert gases such as argon or nitrogen but can also include surface cleaning components such as a minor quantity of oxygen. (Plot subportion 751 is otherwise referred to herein as the temperature versus time profile for the goal-attaining phase, G, of method 700.)

The goal value indicated by plot point 761 may be defined either in terms of temperature as $LTET_G$ or in terms of power as $LTEP_G$. This goal value ($LTET_G$ and/or $LTEP_G$) is selected such that a temperature drop later caused by a later-executed wafer-loading step (plot subportion 753) brings the kit part's temperature to level $LTET_R$, which level is the long term equilibrium temperature of the main subportion 404 of the plasma-processing recipe.

Once the goal state is achieved at plot point 761 for the kit part under consideration, it may be necessary to wait (W phase) for a next wafer to get into position within the router 103 prior to loading that wafer 112 into the plasma chamber 105. If this is the case, the power level of the already ignited warm-up plasma is dropped to a temperature-maintaining that indefinitely maintains the goal level $LTET_G$. As seen by plot subportion 752, the kit part temperature remains substantially constant during the waiting phase W. If no wait is required, plot subportion 752 may be omitted.

At the time of plot point 762, the wafer is ready for loading into the plasma chamber. The warm-up plasma is turned off and the wafer loading phase L begins.

During the wafer loading phase L, the temperature of the kit part drops as indicated by plot subportion 753. If the time interval of the wafer loading phase L is always the same, it may be possible to skip tracking of kit part temperature during this phase L. If cool-down rates or load times fluctuate on a wafer-to-wafer basis during this phase L, it may be preferable to track kit part temperature either by open-loop methods or more preferably by closed loop methods.

At plot point 763, the wafer has loaded and the plasma is ready for striking and for beginning execution of the main subportion 404 of the recipe at the recipe-defined power level, $LTEP_R$.

If at the time of point 763, the temperature of the floating kit part is still above the LTET of this $LTEP_R$ (within a prespecified tolerance such as +/−5%, or +/−2%, or +/−0.5%), an appropriate time delay may be taken to let the kit part cool down into the goal temperature range (to cool to a temperature substantially equal to the LTET of this $LTEP_R$). Then the plasma is ignited and the main subportion 404 of the recipe is executed between points 763 and 764 at the recipe-defined power level, $LTEP_R$.

If at the time of point 763, the temperature of the floating kit part has fallen slightly below the LTET of this $LTEP_R$ (within a prespecified tolerance such as +/−5%, or +/−2%, or +/−0.5%), an essentially inert warm-up plasma consisting for example of argon or helium may be first struck and maintained at the $LTEP_R$ to bring the kit part temperature into the goal temperature range (to a temperature substantially equal to the LTET of this $LTEP_R$). Then the already-ignited plasma is reconfigured to immediately thereafter execute the main subportion 404 of the recipe at the recipe-defined power level, $LTEP_R$.

Note that an essentially inert warm-up plasma at power level $LTEP_R$ may also be used for the case of the kit part being still too warm to ease the temperature that kit part to the $LTET_R$ level, however this will take longer than cooling with no plasma.

The key element to be noted in FIG. 7 is that the kit part temperature between points 763 and 764, during the recipe-executing phase R, is substantially constant as indicated by the flat plot subportion 754. (The temperature of plot subportion 754 is of course preferably above the carbonaceous condensate temperature for the respective floating kit part.)

Unlike the situation for example, of wafer wfr#5 of FIG. 5A where the temperatures of the floating kit parts shift across a range of temperatures (e.g., approximately 305° C. to 330° C. for the thick plot portion identified as 556 in FIG. 5A) during execution of the main subportion 404 of the recipe, in FIG. 7 the main subportion 404 of the recipe executes as indicated by 754 with the kit parts being at the constant equilibrium temperature, $LTET_R$, associated with the recipe-defined power level, $LTEP_R$. This allows for more consistency between the plasma-processing of one wafer and the next. Thus each successive wafer may be processed with same constant kit part temperatures as indicated by plot subportions 754, 754' and 754".

At plot point 764, the recipe main subportion 404 has finished executing, the plasma is turned off and wafer unloading begins. The plasma-off timer 680 or its equivalent is started to track kit part temperature. During the wafer unload phase U, the kit part temperature drops as indicated by plot subportion 755.

At plot point 765, wafer unload has completed and the chamber is ready for a repeat of the goal-attaining phase G' which this time will take the kit part state from point 765 to point 771. Plot subportion 756 corresponds to subportion 751. Plot subportion 752' corresponds to subportion 752. Plot subportions 754' and 754" correspond to subportion 754. The method is repeated as long as necessary to complete wafer plasma-processing with essentially same kit part temperatures being present one wafer after the next.

The above disclosure is to be taken as illustrative of the invention, not as limiting its scope or spirit. Numerous modifications and variations will become apparent to those skilled in the art after studying the above disclosure.

By way of example, flat portions 754, 754', 754" of FIG. 7 may be modified to have a slight positive or negative slope by appropriately modifying the level of the recipe-start point 763 relative to the $LTET_R$. As already explained, an essentially inert warm-up plasma may be ignited and maintained at the $LTEP_R$ power level for a prespecified time between plot subportions 753 and 754 to more accurately home in on temperature level $LTET_R$. Rather than keeping a constant power level for the warm-up plasma it may be desirable to vary the power level of the warm-up plasma over time while still realizing the corresponding, effective average power level and the corresponding end results. Numerous other variations will come to mind in view of the above disclosure.

In general it has been shown that the steady state temperatures of floating kit parts may be more quickly attained prior to the processing of wafers or other workpieces with a given, to-be-repeated plasma-processing recipe (e.g., etch recipe) by pre-heating the plasma chamber to steady state conditions using a chamber-internal warm-up plasma. While the warm-up plasma may be composed of any ignitable one, or a mixture of gases, a relatively inert composition of easily ignitable gases such as one or more gases selected from the group consisting of argon (or another period VIII inert gas), nitrogen, and oxygen is preferred.

Even if steady state temperatures are not attained by pre-recipe warm-up, the igniting and maintaining of a warm-up plasma in the plasma chamber may be nonetheless advantageously carried out for heating one or more of the scavenger-emitting kit parts so as to maintain kit part temperatures at respective goal temperatures that are greater than respective idle temperatures to which the kit parts would otherwise drop during idle time periods when the plasma is not turned in accordance with an executing recipe. For example, if the goal temperatures are above the carbonaceous condensation points of the respective kit parts, the kit part surfaces are kept clean of undesirable carbonaceous condensates.

Given the above disclosure of general concepts and specific embodiments, the scope of protection sought is to be defined by the claims appended hereto.

What is claimed is:

1. A temperature control method practiced in a plasma chamber having one or more plasma-interactive floating parts, where the plasma chamber is used for plasma processing of a succession of workpieces each according to a corresponding process execution recipe, said method comprising the step of:

in idle time periods that precede or occur between repeated executions of said recipe, maintaining a warm-up plasma in said plasma chamber for heating the one or more plasma-interactive floating parts so as to bring temperatures of the one or more plasma-interactive floating parts to respective goal temperatures that are greater than respective idle temperatures to which the floating parts would otherwise decay during the idle time periods.

2. The temperature control method of claim 1 wherein said warm-up plasma is composed mostly of one or more relatively inert gases that do not consume bulk material from the plasma-interactive floating parts.

3. The temperature control method of claim 2 wherein said warm-up plasma is composed mostly of argon.

4. The temperature control method of claim 2 wherein said one or more relatively inert gases include nitrogen.

5. The temperature control method of claim 2 wherein said warm-up plasma includes a minor amount of oxygen.

6. The temperature control method of claim 1 wherein:

the repeated plasma-processings may be carried out one after another in a continuously-repetitive manner such that the continuously-repeated plasma processings tend to produce steady state equilibrium conditions within the plasma chamber, the steady state equilibrium conditions include steady state temperature versus time profiles for the one or more plasma-interactive floating parts; and said warm-up plasma is maintained so as to keep or bring at least one of the one or more plasma-interactive parts substantially close to a respective steady state temperature of the at least one part.

7. The temperature control method of claim 6 wherein a current temperature of one or more of said kit parts is determined by an open-loop technique wherein immediate measurements of kit part temperature are not taken; and said warm-up plasma is responsively maintained so as to keep or bring the so-determined, current temperature of at least one of the one or more plasma-interactive parts substantially close to its respective steady state temperature.

8. The temperature control method of claim 6 wherein a current temperature of one or more of said kit parts is determined by a closed-loop technique wherein real-time measurements of kit part temperature are taken; and said warm-up plasma is responsively maintained so as to keep or bring the so-determined, current temperature of at least one of the one or more plasma-interactive parts substantially close to its respective steady state temperature.

9. The temperature control method of claim 1 wherein said plasma chamber is a high-density plasma chamber used for reactive ion etching of oxides.

10. The temperature control method of claim 9 wherein a reactive ion etching process executed in said high-density plasma chamber employs a fluorocarbon within the plasma and wherein said one or more kit parts emit scavenger particles that partially remove fluorine radicals from the plasma, the kit parts being such that their respective rates of scavenger particle emission are temperature dependent.

11. The temperature control method of claim 1 wherein:

said plasma chamber is used for generating a plasma including condensable components capable of condensing on surfaces of said one or more plasma-interactive kit parts; and said warm-up plasma is maintained so as to keep or bring at least one of the one or more plasma-interactive kit parts above a respective condensation state temperature, the condensation state temperature being one below which said condensable components tend to accumulate on a surface of the at least one plasma-interactive kit part.

12. The temperature control method of claim 11 wherein the condensation state temperature of the at least one plasma-interactive kit part is equal to or greater than 180° C.

13. A method for bringing one or more floating kit parts within a high-density plasma reaction chamber to or near respective steady state conditions associated with uninterrupted steady state repetition of a predefined plasma processing recipe, said method comprising the steps of:

(a) determining at least one steady state temperature of a corresponding kit part under said steady state conditions; and (b) prior to execution of said predefined plasma processing recipe, turning on a high-density warm-up plasma within the chamber to heat the at least one kit part to a temperature equal to or at least substantially near its corresponding steady state temperature so that steady state or near-steady state conditions are attained for the at least one kit part prior to execution of the predefined plasma processing recipe.

14. The temperature control method of claim 13 wherein said turned-on warm-up plasma is composed mostly of one or more relatively inert gases that do not consume substantial amounts of bulk material from the kit parts.

15. The temperature control method of claim 14 wherein said turned-on warm-up plasma is composed mostly of argon.

16. The temperature control method of claim 14 wherein said one or more relatively inert gases include nitrogen.

17. The temperature control method of claim 13 wherein said turned-on warm-up plasma includes oxygen.

18. A method for bringing one or more floating kit parts within a plasma chamber to or near respective goal temperatures prior to execution of a predefined plasma-processing recipe, the respective goal temperature of each floating kit part being a temperature associated with uninterrupted steady state repetition of the predefined plasma processing recipe, said method comprising the steps of:

(a) defining directly or indirectly, a pre-recipe goal temperature for a corresponding kit part, said goal temperature being one to be attained by the corresponding kit part just prior to execution of said recipe;

(b) determining a current temperature-indicating condition of the corresponding kit part prior to execution of said predefined plasma processing recipe;

(c) if the determined current temperature-indicating condition indicates a current temperature that is substantially less than the defined pre-recipe goal temperature of the corresponding at least one kit part, turning on a warm-up plasma within said chamber prior to execution of said predefined plasma processing recipe so as to heat the at least one kit part.

19. The temperature control method of claim 18 further comprising the step of:

(d) if the determined current temperature-indicating condition indicates a current temperature that is substantially greater than the determined goal temperature of the corresponding at least one kit part, preventing a turning on of or maintenance of a plasma within said chamber for a length of time prior to execution of said predefined plasma processing recipe so as to allow the at least one kit part to cool.

20. The temperature control method of claim 19 wherein the respective step of heating the at least one kit part or allowing the at least one kit part to cool is carried out until the current temperature of the at least one kit part is determined by said current temperature-indicating condition to be within approximately 10% of the goal temperature.

21. The temperature control method of claim 20 wherein the respective step of heating the at least one kit part or allowing the at least one kit part to cool is carried out until the current temperature-indicating condition of the at least one kit part is determined to be within approximately 1% of a corresponding goal temperature-indicating condition.

22. A method for obtaining substantially same kit part temperatures for one or more floating kit parts of a plasma chamber while performing plasma-processing on a succession of workpieces in accordance with a predefined plasma-processing recipe, said recipe having at least one constant-power subportion, said method comprising the steps of:

(a) identifying a constant-power subportion of the recipe during which said floating kit parts are to be maintained at the substantially same kit part temperatures; and (b) using a warm-up plasma to heat the one or more floating kit parts each to a corresponding goal temperature greater than the corresponding substantially same kit part temperature that is to be maintained during the identified subportion of the recipe, said goal temperature being such that the temperature of each kit part decays to its corresponding substantially same kit part temperature during a workpiece loading phase (L) of each execution of the recipe.

23. A method for bringing one or more plasma-interactive parts within a plasma chamber to or near respective goal energy-states prior to execution of a predefined plasma-processing recipe on a workpiece, the respective goal energy-state of each plasma-interactive part being one that is associated with uninterrupted steady state repetition of the recipe, said method comprising the steps of:

(a) defining a pre-recipe goal energy-state for a corresponding plasma-interactive part, said goal energy-state being one to be attained by the part just prior to execution of said recipe;

(b) determining a current energy-state of the corresponding plasma-interactive part prior to execution of said predefined plasma processing recipe;

(c) if the determined current energy-state indicates an energy level that is substantially less than that of the defined pre-recipe goal energy-state of the corresponding at least one plasma-interactive part, responsively energizing a warm-up plasma within said chamber prior to execution of said predefined plasma processing recipe so as to raise the energy level of the at least one plasma-interactive part.

24. The energy-state control method of claim 23 wherein said step (b) of determining the current energy-state is carried out in an open-loop manner.

25. The energy-state control method of claim 23 wherein said step (b) of determining the current energy-state is carried out in a closed-loop manner.

26. A machine-implemented control method for pre-conditioning a plasma processing chamber prior to execution, on a supplied workpiece, of a predefined plasma processing recipe, where the plasma processing chamber includes one or more plasma-interactive parts whose energy states affect the plasma processing of the supplied workpiece, said method comprising the steps of:

(a) tracking the energy states of at least one of the plasma-interactive parts;

(b) defining a goal energy state at which the tracked plasma-interactive part is to be upon the start of execution of said plasma processing recipe;

(c) determining from said tracking whether a current energy state of the tracked plasma-interactive part is substantially different from the goal energy state prior to the start of execution of said plasma processing recipe such that the plasma processing of the supplied workpiece will be substantially changed by the determined difference between the goal energy state and the current energy state; and (d) in response to a finding by said step of determining that the current energy state of the tracked plasma-interactive part is substantially different from the goal energy state, energizing and maintaining a warm-up plasma within said plasma processing chamber prior to the start of execution of said recipe so as to bring the energy level of the tracked plasma-interactive part substantially to said goal energy state.

27. A machine-implemented control method according to claim 26 further comprising the step of:

(e) loading the workpiece into the plasma processing chamber after said step (d) of energizing and maintaining the warm-up plasma.

28. A machine-implemented control method according to claim 26 further comprising the step of:

(e) carrying out steps (a) through (d) within one or more programmable computers.

29. A machine-implemented control method according to claim 26 wherein said step (a) of tracking is carried out in an open-loop manner.

30. A machine-implemented control method according to claim 26 wherein said step (d) of energizing and maintaining includes maintaining the warm-up plasma at a goal-maintaining power level, the goal-maintaining power level being such that said goal energy state is the equilibrium energy state of the tracked plasma-interactive part when the goal-maintaining power level is maintained indefinitely.

31. A machine-implemented control method according to claim 26 further comprising the step of:
(e) unloading a plasma-processed workpiece from the plasma processing chamber after execution of a main portion of the predefined plasma processing recipe and thereafter repeating said step (d) of energizing and maintaining the warm-up plasma for a next-supplied workpiece.

\* \* \* \* \*